(12) United States Patent
Utsunomiya

(10) Patent No.: US 8,118,083 B2
(45) Date of Patent: Feb. 21, 2012

(54) CIRCULATION-TYPE LIQUID COOLING APPARATUS AND ELECTRONIC DEVICE CONTAINING SAME

(75) Inventor: Motoyasu Utsunomiya, Tokyo (JP)

(73) Assignee: NEC Viewtechnology, Ltd., Tokyo (JP)

( * ) Notice: Subject to any disclaimer, the term of this patent is extended or adjusted under 35 U.S.C. 154(b) by 596 days.

(21) Appl. No.: 12/216,902

(22) Filed: Jul. 11, 2008

(65) Prior Publication Data

US 2008/0277102 A1    Nov. 13, 2008

Related U.S. Application Data

(62) Division of application No. 11/205,110, filed on Aug. 17, 2005, now Pat. No. 7,717,161.

(30) Foreign Application Priority Data

Aug. 18, 2004    (JP) .................................. 2004-238176

(51) Int. Cl.
    *F28D 15/00* (2006.01)
    *F28F 7/00* (2006.01)
(52) U.S. Cl. ............. 165/104.28; 165/80.2; 165/104.31; 165/104.33
(58) Field of Classification Search .................. 165/80.2, 165/80.3, 80.4, 104.28, 104.31, 104.33
    See application file for complete search history.

(56) References Cited

U.S. PATENT DOCUMENTS

| | | | |
|---|---|---|---|
| 4,787,445 A | 11/1988 | Howcroft | |
| 5,198,889 A * | 3/1993 | Hisano et al. | 257/678 |
| 6,166,907 A * | 12/2000 | Chien | 165/104.33 |
| 6,282,913 B1 * | 9/2001 | Moriguchi et al. | 62/259.2 |
| 6,324,058 B1 * | 11/2001 | Hsiao | 165/80.4 |
| 6,408,937 B1 * | 6/2002 | Roy | 165/104.33 |
| 6,450,646 B1 | 9/2002 | Ono | |
| 6,556,439 B2 * | 4/2003 | Shibasaki | 165/80.2 |
| 6,563,709 B2 * | 5/2003 | Negishi et al. | 165/80.4 |
| 6,600,649 B1 * | 7/2003 | Tsai et al. | 165/104.33 |

(Continued)

FOREIGN PATENT DOCUMENTS

JP    60-92890 U    6/1985

(Continued)

OTHER PUBLICATIONS

Japanese Office Action dated Jan. 10, 2007, with partial English translation.

(Continued)

*Primary Examiner* — Ljiljana Ciric
(74) *Attorney, Agent, or Firm* — McGinn IP Law Group, PLLC

(57) ABSTRACT

A cooling apparatus includes a tank for keeping a coolant liquid therein and including an air layer, a heat receiver in contact with a heat generating part for receiving heat therefrom, a radiator for radiating the heat absorbed by the coolant liquid, and a circulating mechanism for circulating the coolant liquid from the heat receiver through the tank, through the radiator and again to the heat receiver. The tank is mounted on the radiator. The radiator includes a coolant liquid circulating conduit for radiation which includes a width narrower at the middle position of the tank, and is divided by a gap at the middle position of the tank. The radiator includes cavities on both sides of a portion in which the gap in the coolant liquid circulating conduit is formed, each of the cavities having an area covered with the tank mounted on the radiator.

14 Claims, 25 Drawing Sheets

U.S. PATENT DOCUMENTS

| | | | |
|---|---|---|---|
| 6,623,144 B2 | 9/2003 | Bornhorst | |
| 6,763,880 B1 * | 7/2004 | Shih | 165/80.4 |
| 6,778,394 B2 * | 8/2004 | Oikawa et al. | 165/80.4 |
| 6,826,049 B2 * | 11/2004 | Chen | 165/104.33 |
| 6,843,310 B1 * | 1/2005 | Chen | 165/104.33 |
| 6,867,973 B2 * | 3/2005 | Chang | 165/80.4 |
| 7,013,959 B2 * | 3/2006 | Lee et al. | 165/104.33 |
| 7,028,761 B2 * | 4/2006 | Lee et al. | 165/104.33 |
| 7,226,171 B2 | 6/2007 | Fujimori | |
| 7,270,418 B2 | 9/2007 | Fujimori | |
| 7,360,903 B2 | 4/2008 | Yamada | |
| 7,384,152 B2 | 6/2008 | Takeuchi | |
| 7,407,000 B2 * | 8/2008 | Lee et al. | 165/104.33 |
| 7,422,053 B2 * | 9/2008 | Siu | 165/104.33 |
| 7,739,883 B2 * | 6/2010 | Scott | 165/80.3 |
| 7,770,630 B2 * | 8/2010 | Chesser et al. | 165/104.33 |
| 2002/0023448 A1 | 2/2002 | Ito et al. | |
| 2002/0163625 A1 | 11/2002 | Tabuchi et al. | |
| 2002/0191159 A1 | 12/2002 | Nagao et al. | |
| 2004/0233632 A1 | 11/2004 | Chang | |
| 2004/0250814 A1 | 12/2004 | Post et al. | |
| 2005/0117077 A1 | 6/2005 | Utsunomiya | |
| 2005/0185244 A1 | 8/2005 | Fujimori et al. | |

FOREIGN PATENT DOCUMENTS

| | | |
|---|---|---|
| JP | 01-265226 A | 10/1989 |
| JP | 4-79462 | 7/1992 |
| JP | 5-265601 A | 10/1993 |
| JP | 6-266474 | 9/1994 |
| JP | 11-282361 A | 10/1999 |
| JP | 2000-077585 A | 3/2000 |
| JP | 2002-366260 | 12/2002 |
| JP | 2003-22148 | 1/2003 |
| JP | 2003-78271 | 3/2003 |
| JP | 2003-176873 A | 6/2003 |
| JP | 2003-209210 | 7/2003 |
| JP | 2003-304086 | 10/2003 |
| JP | 2004-38105 A | 2/2004 |
| JP | 2004-47842 | 2/2004 |
| JP | 2004-47922 | 2/2004 |
| JP | 2004-77883 A | 3/2004 |
| JP | 2004-84958 | 3/2004 |
| JP | 2005-103440 | 4/2005 |
| JP | 2005-227353 A | 8/2005 |
| JP | 2005-285947 | 10/2005 |
| JP | 2005-317877 | 11/2005 |
| JP | 2006-49382 | 2/2006 |
| WO | WO 02/19027 A1 | 3/2002 |

OTHER PUBLICATIONS

Japanese Office Action dated Aug. 8, 2007 (with partial English translation).

* cited by examiner

Fig. 5A (PRIOR ART)
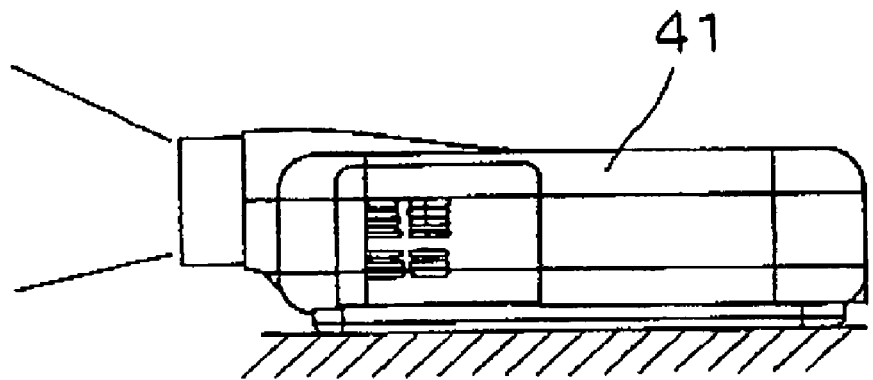
Fig. 5B (PRIOR ART)
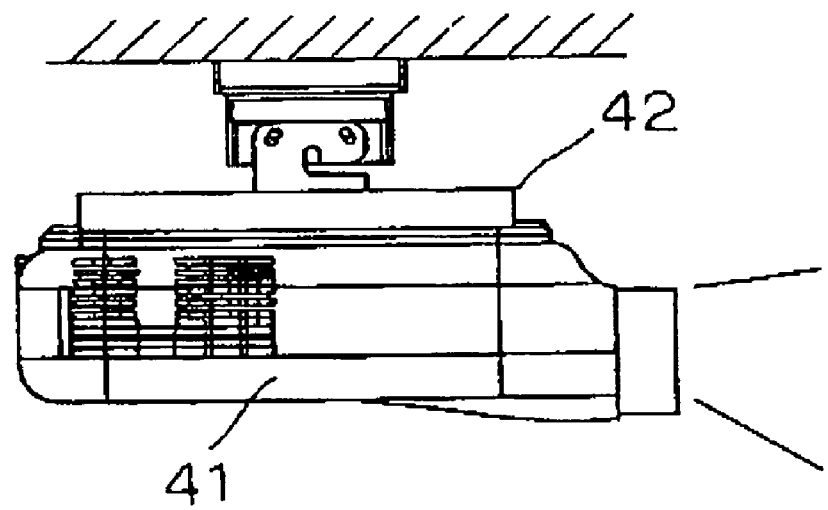

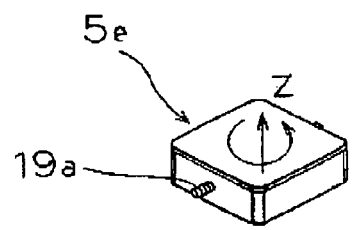
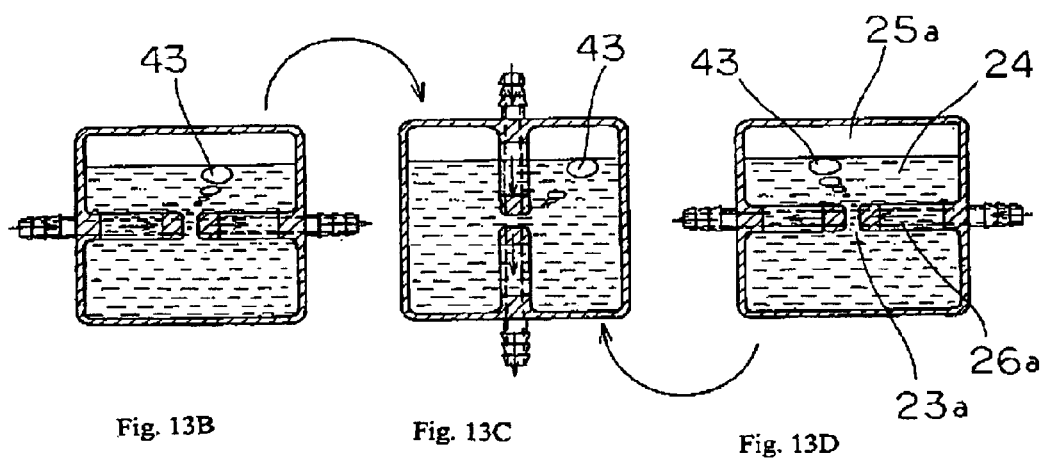
Fig. 13A
Fig. 13B    Fig. 13C    Fig. 13D

Section A-A

CIRCULATION-TYPE LIQUID COOLING APPARATUS AND ELECTRONIC DEVICE CONTAINING SAME

The present Application is a Divisional Application of U.S. patent application Ser. No. 11/205,110, filed on Aug. 17, 2005 now U.S. Pat. No. 7,717,161.

BACKGROUND OF THE INVENTION

1. Field of the Invention

The present invention relates to a cooling structure for an electronic device which is equipped with heat generating elements, and more particularly, to the structure of a tank for keeping a coolant liquid (hereinafter simply called the "reservoir tank") in a circulation-type liquid cooling system.

2. Description of the Related Art

In recent years, as the performance of electronic devices increases, parts mounted in such electronic devices have generated increasingly more amounts of heat. As a result, stricter requirements have been imposed on cooling technology for devices. In the field of computers, as a result of increasing the number of transistors on a processor (CPU) and raising the operating clock frequency of the CPU to improve the processing performance and processing speed of the CPU, electric power density of a chip has increased to such a degree that TDP (Thermal Design Power) exceeds 30 W even in mobile applications. As such, there is an urgent necessity to establish an effective cooling technology for removing heat generated within a housing.

Conventionally, for cooling an electronic device such as a personal computer, a heat sink is connected to a heat generating element such as a CPU to spread heat which is then discharged to the outside of a housing by use of forced air cooling. Recently, however, device-cooling methods based on liquid cooling technology have been under investigation because of their higher heat radiation performance and quiet operation.

FIG. 1 illustrates the structure of a liquid cooling system mainly used in personal computers.

Liquid cooling system 1 comprises radiator 3a, circulating pump 4a, reservoir tank 5a, and heat receiving element 2a such as a cold plate. Heat receiving element 2a is connected to heat generating element 6 such as a CPU and a GPU for absorbing heat therefrom, and transports the amount of received heat to radiator 3a through a coolant liquid which flows within heat receiving element 2a. Radiator 3a exchanges heat with external air through natural air cooling or a combination of the natural air cooling with forced air cooling in order to radiate heat. The coolant liquid cooled by radiator 3a is transported again to heat receiving element 2a by circulating pump 4a. The circulation-type liquid cooling system configured in the manner described above is provided with reservoir tank 5a for keeping an amount of coolant liquid that is required to compensate for a lost amount of the coolant liquid due to volatilization from component members (mainly from resin tube 7a).

FIGS. 2 and 3 illustrate a modular structure of such a liquid cooling system. FIG. 2 illustrates a general-purpose liquid cooling module for use in desk top personal computers (PCs) and the like, while FIG. 3 illustrates a thin-type liquid cooling module for use in notebook-type personal computers and the like. While both modules employ common components, the shape of a radiator and the like may be modified in accordance with the characteristics of a particular housing in which the liquid cooling system is mounted.

The aforementioned reservoir tank, which forms part of a liquid cooling system, is responsible for the following three functions: (1) keeping a required amount of coolant liquid during a device for a guaranteed period; (2) alleviating of variations in the pressure within a circulating system due to an expanded volume of the coolant liquid caused by received heat; and (3) trapping and removal of bubbles generated within the circulating system.

A resin tube for interconnecting components of a liquid cooling system permits volatilization of moisture of the coolant liquid through its molecular interstices. For this reason, anti-freeze condenses over a long-term use, and variations in viscosity due to a change in concentration degrades the coolant circulating performance, resulting in lower cooling performance of the system. Therefore, for guarantee the operation for a specific period, it is necessary to keep a surplus amount of coolant liquid in anticipation that an amount of moisture will volatilize, so that a reservoir tank is provided for pooling the coolant liquid.

Also, during the operation of an apparatus, coolant liquid, which has absorbed heat from heated devices, expands in volume as it is heated to increase the inner pressure of a circulating path. In this event, an air layer must be provided, as well, for alleviating the pressure within the circulating system in order to prevent the coolant liquid from leaking from a module junction. To meet this requirement, the liquid level (boundary between the liquid and air layer) is adjusted within the reservoir tank to ensure that there is a required amount of air capacity.

Likewise, during operation of the apparatus, bubbles can be produced within the circulating path due to introduction of air from the outside of the system, cavitation, decomposition of the liquid, and the like. If the bubbles stay within the path and block it, the coolant liquid cannot be circulated, possibly causing a loss in the cooling capabilities of the system. Also, if the bubbles within the liquid enter a thin flow between a rotor and a main shaft of a circulating pump, a gap is blocked which results in a semi-dry lubrication or a solid lubrication state between the main shaft and the rotor, which causes the generation of sudden abrasive heating which would damage the pump's bearings. Consequently, the lifetime of the pump is reduced. Further, if the bubbles are deposited such that they cause the entire rotor to be surrounded by an air layer, the pump becomes incapable of pumping the coolant liquid, resulting in a failure to circulate the coolant liquid. For this reason, bubbles staying within the system are released into the air layer to alleviate the pressure within the reservoir tank.

Exemplary applications of such a liquid cooling system are known from configurations described in JP-A-266474/1994, JP-A-366260/2002, JP-A-022148/2003, JP-A-209210/2003, JP-A-047842/2004, and the like. FIGS. 4A and 4B illustrate an example of a conventional liquid cooling system which is disclosed in JP-A-209210/2003. Heat receiving element 2d such as a cold plate is mounted on the main body of notebook type personal computer 10 to cool down CPU 11, while a thin radiator comprised of radiator tube 13 and metal radiator plate 14 are mounted on display 12 to dispel heat.

In this configuration, reservoir tank 5d that is used to store coolant liquid is fixed on the radiator to maintain a required amount of coolant liquid for a guaranteed period and to remove bubbles produced in the circulating system, thereby helping the circulating pump to operate normally.

When such a liquid cooling system is employed as a cooling means for an electronic device that can be installed in different orientations, depending on the requirements of a particular user, the function of the aforementioned reservoir tank does not work well in some situations.

Taking as an example a projector apparatus for projecting an image onto a screen, the apparatus may be installed on a floor for use as illustrated in FIG. 5A, or the apparatus may be suspended from a ceiling for use in an inverted position as illustrated in FIG. 5B. In addition, depending on certain conditions, it is contemplated that the apparatus may be installed in an upright posture for projection through reflection at right angles.

However, the conventional liquid cooling system is designed on the assumption that the apparatus with which it is used operates in the same orientation at all times. Also, the reservoir tank is not designed to support any orientation in an apparatus in which the reservoir tank is installed at any angle over 360 degrees, rather, the reservoir tank is simply a closed case having an inlet port and an outlet port with a proper amount of coolant liquid 24a stored therein.

The conventional reservoir tank in such a structure is highly likely to significantly lose cooling performance due to an air layer within the tank which readily blocks the conduit inlet and outlet ports, following a change in the position of the apparatus, which prevents the coolant liquid from circulating. In particular, in the reservoir tanks disclosed in JP-A-304086/2003 and JP-A-08958/2004, only the opening at the end of an outlet tube within the tank is positioned at the center of the tank, while the opening at the end of an inlet tube within the tank is set largely spaced away from the opening at the end of the outlet tube within the tank. In this structure, the reservoir tank does function without an air within the tank approaching to the opening at the end of the inlet tube within the tank as long as the position is changed within a particular range (from 0.degree. to 90.degree.), but the reservoir tank is not designed to accommodate any changes in positioning from 0.degree. to 360.degree.

JP-A-078271/2003 describes an exemplary reservoir tank which is capable of supporting a change in orientation from 0.degree. to 360.degree. However, the disclosed reservoir tank has the open end of an inlet tube and the open end of an outlet tube arranged in parallel in the same direction at the center of the tank. In this arrangement, since the open ends of the inlet tube and outlet tube are exposed, a change in the orientation of the tank is likely to cause air in the reservoir tank to flow again into a conduit. In other words, even if bubbles in the path are trapped and kept in the air layer within the tank, the bubbles will flow back into the conduit when the orientation of the tank is changed, resulting in a high susceptibility to detrimental effects such as clogging of the conduit by bubbles, damage to a pump, and the like.

SUMMARY OF THE INVENTION

It is an object of the present invention to provide a cooling apparatus for an electronic device utilizing a liquid cooling system, which supports any orientation in which the electronic device is installed in whichever direction, and prevents accumulated air from again flowing into a conduit in the event of a change in orientation of the electronic device.

A cooling apparatus according to the present invention includes a tank for keeping a coolant liquid therein and having an air layer, heat receiving means in contact with a heat generating part to receive heat therefrom, radiating means for radiating heat absorbed by a coolant liquid, and a circulating mechanism for circulating the coolant liquid from the heat receiving means through the tank and through radiating means again to the heat receiving means. The tank has a conduit forming area for forming a coolant liquid circulating conduit that passes a middle position of the tank, and a narrow gap which divides the conduit forming area at the middle position of the tank.

In the foregoing configuration, the coolant liquid circulating conduit is formed within the tank such that the conduit passes the middle position of the tank, and the coolant liquid circulating conduit is opened at the middle position of the tank. Accordingly, an air layer provided in the tank for alleviating the pressure will not be introduced into the opening of the coolant liquid circulating conduit formed by dividing the conduit by the narrow gap at the middle position of the tank, even if the air layer changes its position in conformity to a change in the orientation of the apparatus. Further, when the orientation of the tank is changed, minute bubbles produced within the conduit can be efficiently removed via the narrow gap formed by dividing the conduit forming area at the middle position of the tank. Consequently, a stable coolant circulation can be ensured in any orientation taken by the apparatus.

In particular, the openings of the coolant liquid circulating conduit, which are formed by dividing the conduit via the narrow gap, are opposite to each other at the middle position of the tank, and are hidden from the outside, so that air in the tank is unlikely to again flow into the conduit upon change in the orientation of the tank. In this respect, the reservoir tank in the present invention is advantageous over the reservoir tank described in JP-A-078271/2003.

The cooling apparatus according to the present invention, when used, eliminates restrictions on the orientation in which a liquid cooling system is installed, so that liquid cooling technology can be applied as well to electronic devices which can be installed in various orientations, like a projector apparatus.

The above and other objects, features and advantages of the present invention will become apparent from the following description with reference to the accompanying drawings which illustrate examples of the present invention.

BRIEF DESCRIPTION OF THE DRAWINGS

FIGS. 5A and 5B are side views each illustrating an orientation in which a projector apparatus is installed;

FIGS. 13A to 13D are diagrams illustrating in combination how an accumulated layer of air moves when the orientation of the reservoir tank in FIG. 6 is changed about a Z-axis;

DETAILED DESCRIPTION OF THE PREFERRED EMBODIMENTS

First Embodiment

Figure 1:
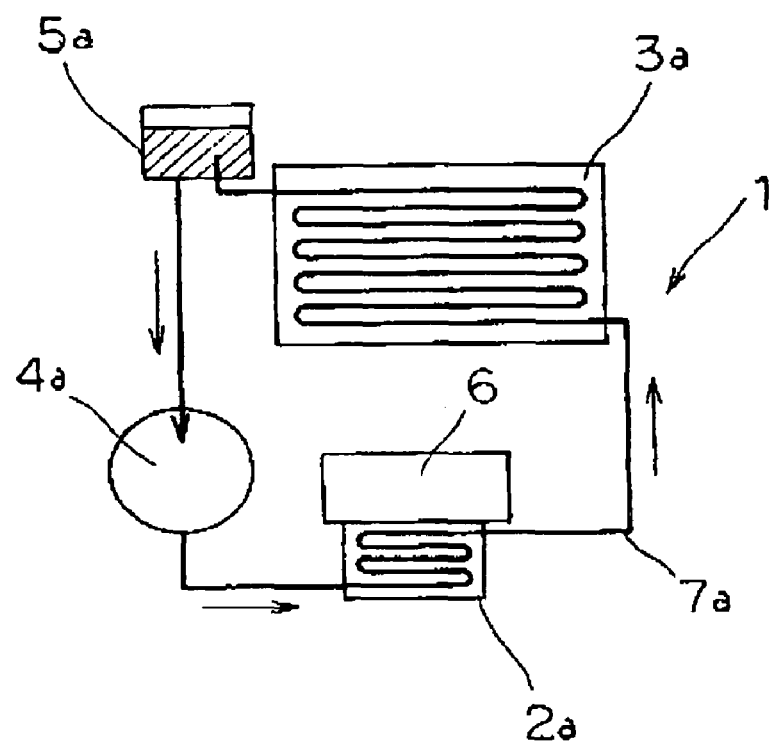
FIG. 1 is a diagram schematically illustrating the structure of a conventional liquid cooling system.
Figure 2:
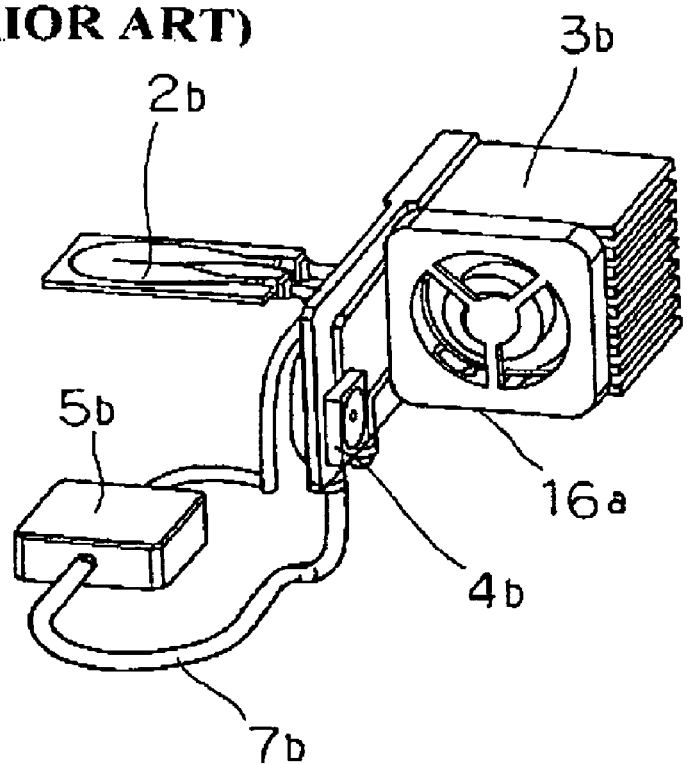
FIG. 2 is a perspective view illustrating the structure of a conventional general-purpose liquid cooling system.
Figure 3:
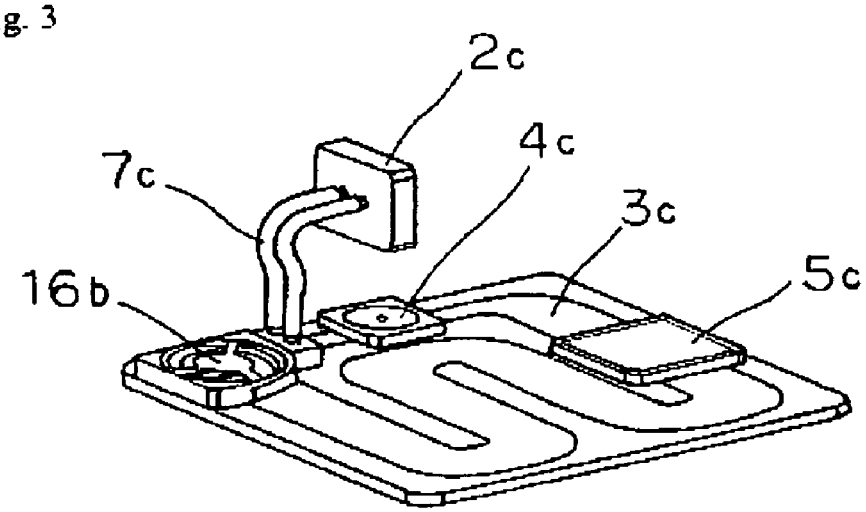
FIG. 3 is a perspective view illustrating the structure of a conventional thin-type liquid cooling system.
Figure 4A:
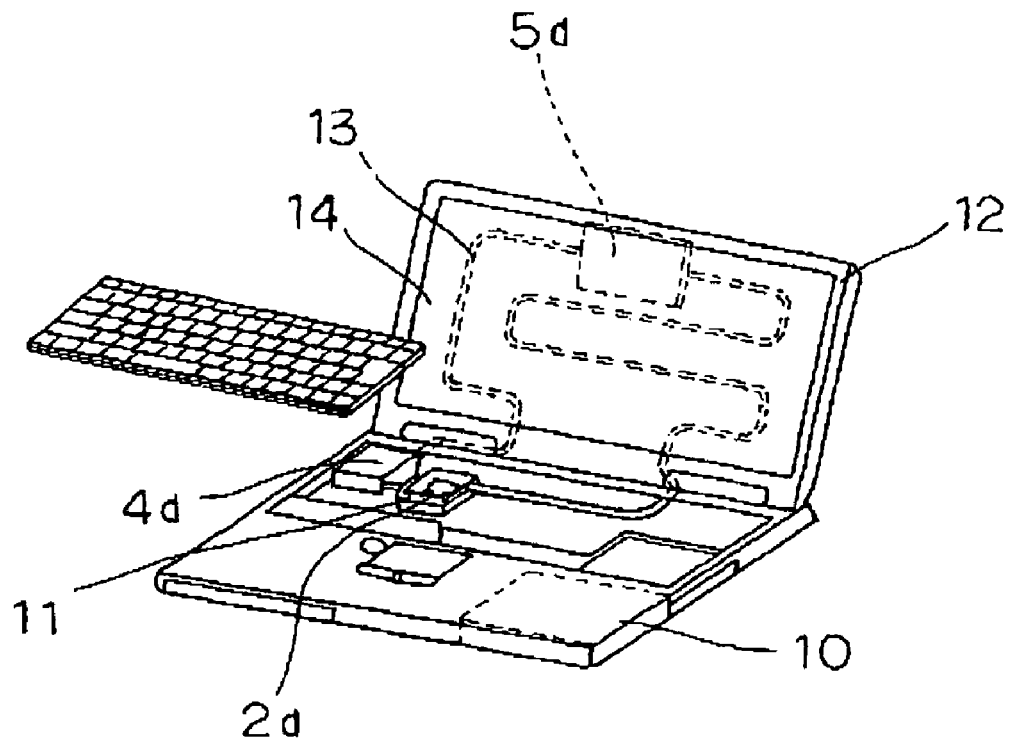
FIGS. 4A and 4B are diagrams illustrating the structure of an electronic device equipped with a liquid cooling system shown in JP-A-209210/2003.
Figure 4B:
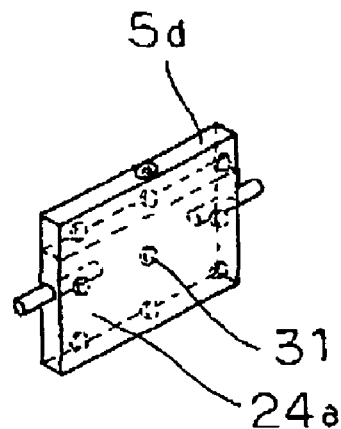
Figure 6:
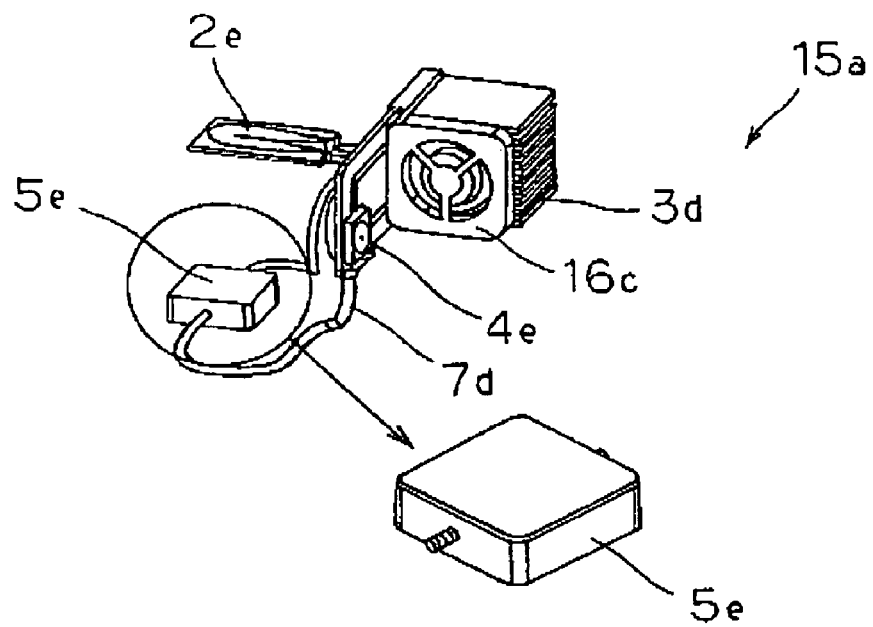
FIG. 6 is a diagram generally illustrating the structure of a cooling apparatus according to a first embodiment of the present invention and a reservoir tank associated therewith.
Figure 7:
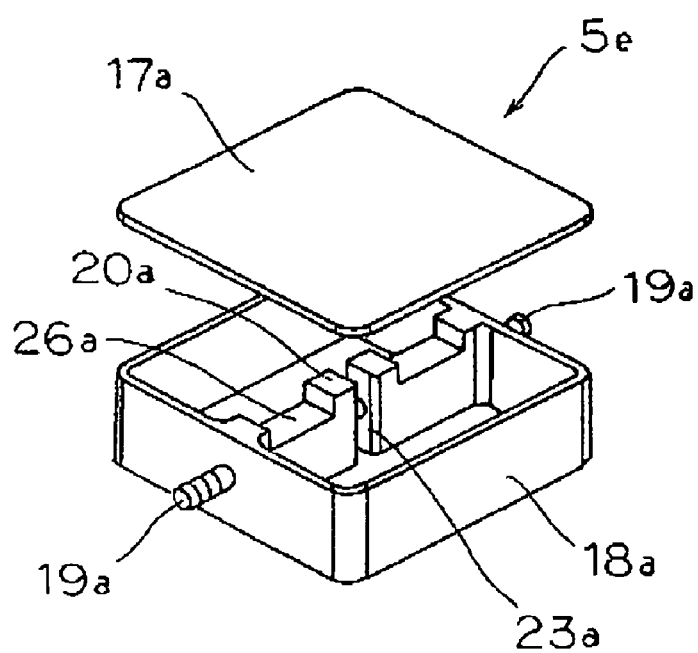
FIG. 7 is a diagram illustrating the internal structure of the reservoir tank in FIG. 6.
Figure 8:
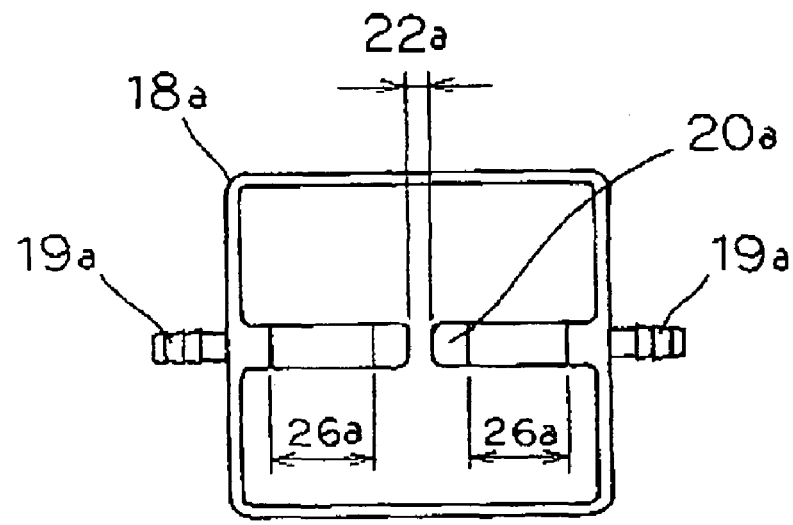
FIG. 8 is a front view of the reservoir tank in FIG. 6.
Figure 9:
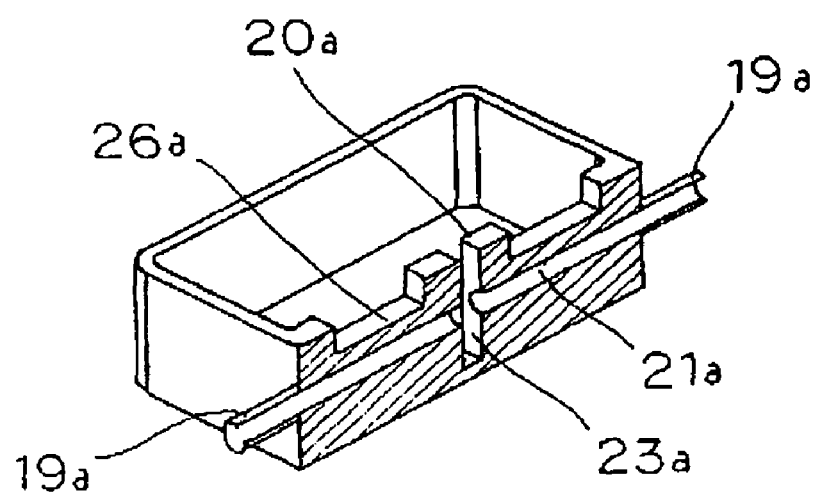
FIG. 9 is a perspective cross-sectional view of the reservoir tank in FIG. 6.
Figure 10:
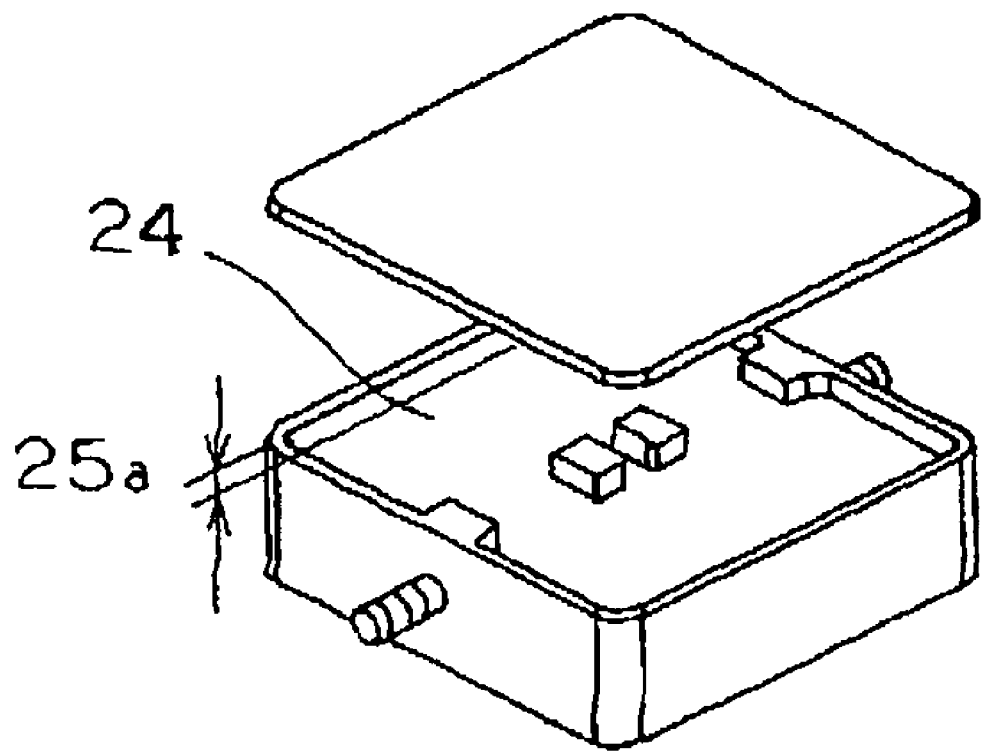
FIG. 10 is a diagram illustrating the structure of the reservoir tank in FIG. 6 when it is filled with a coolant.

FIGS. 6 to 10 illustrate the structure of a reservoir tank associated with a cooling apparatus according to a first embodiment of the present invention. FIG. 6 generally illustrates the reservoir tank; FIG. 7 illustrates the internal structure of the reservoir tank; FIG. 8 is a front view of the reservoir tank; FIG. 9 is a vertically sectioned perspective view of the reservoir tank; and FIG. 10 illustrates the structure of the reservoir tank when it is filled with a coolant liquid.

In FIGS. 6 to 10, cooling apparatus 15a of this embodiment comprises radiator 3d, radiation fan 16c, circulating pump 4e, reservoir tank 5e, and heat receiving element 2e such as a cold plate. Reservoir tank 5e is joined to resin tube 7d, which interconnects components of cooling apparatus 15a, for keeping a coolant liquid, retaining an air layer for buffering thermal expansion of the cooling liquid, and trapping bubbles produced in a circulating system, as illustrated in FIG. 6.

As illustrated in FIG. 7, reservoir tank 5e comprises tank body unit 18a and tank cover 17a which are joined together to make up reservoir tank 5e. In some cases, tube joint 19a, which is provided as a separate member, is hermetically connected to tank body unit 18a.

Bridge 20a is formed with tank body unit 18a, on a center axis of the reservoir tank which connects an inlet port and an outlet port of the coolant liquid, as illustrated in FIGS. 7 and 8. As illustrated in FIG. 9, a through-hole which serves as coolant liquid circulating conduit 21a is formed in bridge 20a. Also, narrow gap 22a (see FIG. 8) is defined in bridge 20a, which is a conduit forming member, at a middle position of tank body unit 18a. Narrow gap 22a divides coolant liquid circulating conduit 21a to form fault 23a in bridge 20a for trapping air.

The reservoir tank in the structure as described above is filled with a proper amount of coolant liquid 24, as illustrated in FIG. 10, and an inlet end and an outlet end of resin tube 7d are connected to tube joint 19a to build a circulation-based liquid cooling system. The amount of coolant liquid filled in the reservoir tank in this case is adjusted to ensure that the accumulated layer of air 25a (see FIG. 10) has a constant capacity in an upper portion of the tank. The accumulated layer of air 25a, thus ensured, alleviates an increase in the internal pressure of the circulating system by receiving variations in volume of the coolant liquid due to thermal expansion by the accumulated layer of air 25a to prevent leakage of the coolant liquid and therefore guarantees the reliability of the apparatus.

Here, the capacity of the accumulated layer of air 25a depends on the area of the wetted perimeter of resin tube 7a, the total amount of the coolant liquid, and the withstanding pressure of the system, so that the respective factors are correlated to one another. Specifically, the total amount of coolant liquid depends on the length of a circulating conduit of the system; the area of the wetted perimeter of the resin tube depends on the length of the circulating conduit; and the area of the wetted perimeter of the resin tube affects the amount of coolant that is dissipated through volatilization, so that the amount of coolant liquid that fills in the reservoir tank is determined by a trade-off between the foregoing design parameters and a guaranteed period of an electronic device which is equipped with the cooling apparatus. In this event, since the amount of change in volume due to thermal expansion is determined by the amount of coolant liquid that is provided, the volume of the accumulated air that is necessary is determined so that it can accommodated a specified withstanding pressure of the circulating system within the liquid cooling system. However, when the volume of the accumulated air occupies one-half or more of the tank volume, the conduit opening will be disrupted by the accumulated air which moves when the tank's orientation is changed, even in the configuration in which the opening of the coolant liquid circulating conduit tube is positioned at the center of the tank. From the foregoing, the volume of the accumulated air is preferably one-third or less of the tank volume.

As illustrated in FIGS. 7 to 9, in front and at the back of air trapping fault 23a in bridge 20a of reservoir tank 5e, cut groove 26a is formed to define a space for moving the accumulated air. Specifically, when reservoir tank 5e is placed upside down, resulting from a change in the posture of an installed electronic device which is equipped with the cooling apparatus, cut groove 26a is defined such that air layer 25a passes through the space in cut groove 26a when air layer 25a moves to a different staying position, thereby avoiding the air from flowing back from air trapping fault 23a to coolant circulating conduit 21a.

FIGS. 11A to 11D, 12A to 12D, and 13A to 13D illustrate bubble trapping operations of reservoir tank 5e of the embodiment described above in accordance with different orientations in which the apparatus containing the reservoir tank is installed.

Figure 11A:
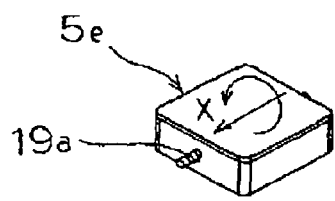
FIGS. 11A to 11D are diagrams illustrating in combination how an accumulated layer of air moves when the orientation of the reservoir tank in FIG. 6 is changed about an X-axis.
Figure 11B:
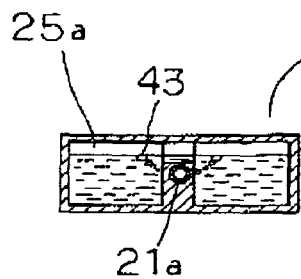
Figure 11C:
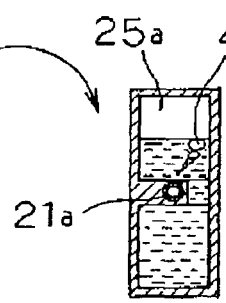
Figure 11D:
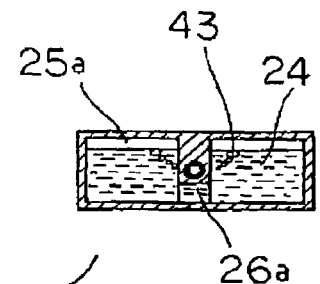
Figure 12A:
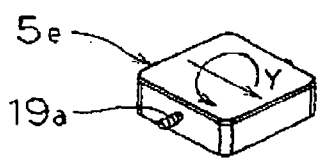
FIGS. 12A to 12D are diagrams illustrating in combination how an accumulated layer of air moves when the orientation of the reservoir tank in FIG. 6 is changed about a Y-axis.
Figure 12B:
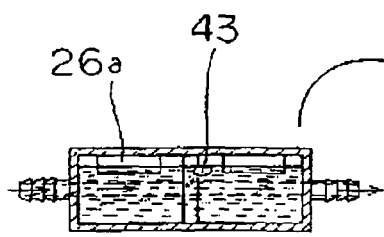
Figures 12C, 12D:
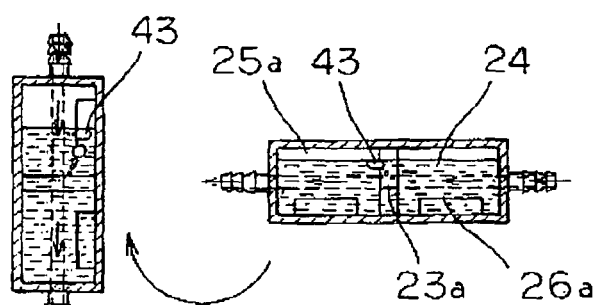

FIGS. 11B to 11D illustrate how the accumulated layer of air 25a in the reservoir tank moves in relation to a rotation of the reservoir tank about the coolant liquid circulating conduit (about an X-axis in FIG. 11A); FIGS. 12B to 12D illustrate how the accumulated layer of air 25a in the reservoir tank moves in relation to a rotation of the reservoir tank about an axis orthogonal to the coolant liquid circulating conduit (about a Y-axis in FIG. 12A); and FIGS. 13B to 13D illustrate how the accumulated layer of air 25a in the reservoir tank moves in relation to a rotation about a vertical axis (about a Z-axis in FIG. 13A). FIGS. 11C, 12C, 13C each illustrate a state that is rotated by 90.degree. from the state illustrated in FIGS. 11B, 12B, 13B, respectively, and FIGS. 11D, 12D, 13D each illustrate a state that is rotated by 90.degree. from the state illustrated in FIGS. 11C, 12C, 13C, respectively. These figures also illustrate how minute bubbles 43 within the circulating conduit are trapped by air trapping fault 23a and combined with the accumulated layer of air 25a.

In this way, by providing fault 23a of coolant liquid circulating conduit 21 at the center of the reservoir tank, the accumulated layer of air 25a will not interfere with the position of the conduit opening (fault for trapping air) as a result of any change in the tank's orientation, so that the coolant liquid can be stably pumped out without sending air into the circulating conduit. Also, bubbles 43 produced during the operation can be effectively removed from the conduit through fault 23a which is used for trapping air. Further, since cut groove 26a is defined to facilitate movements of the air layer in the event of a change in orientation, through the space of cut groove 26a formed in bridge 20a within the tank body, bubbles will barely flow back toward the conduit opening.

With the provision of the reservoir tank configured as described above, the resulting liquid cooling system can operate in any orientation in which the apparatus that contains the tank is installed.

Second Embodiment

Figure 14:
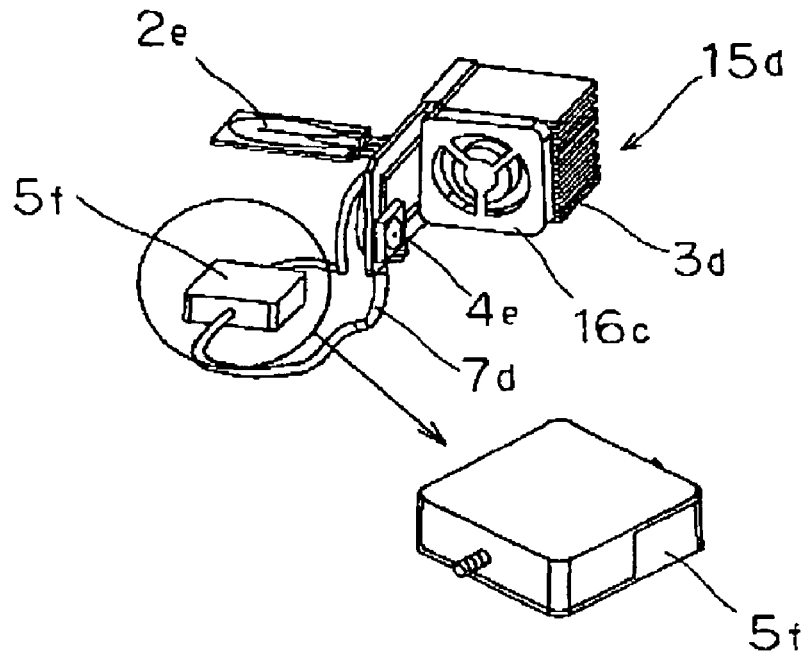
FIG. 14 is a diagram generally illustrating the structure of a cooling apparatus according to a second embodiment of the present invention and a reservoir tank associated therewith.
Figure 15:
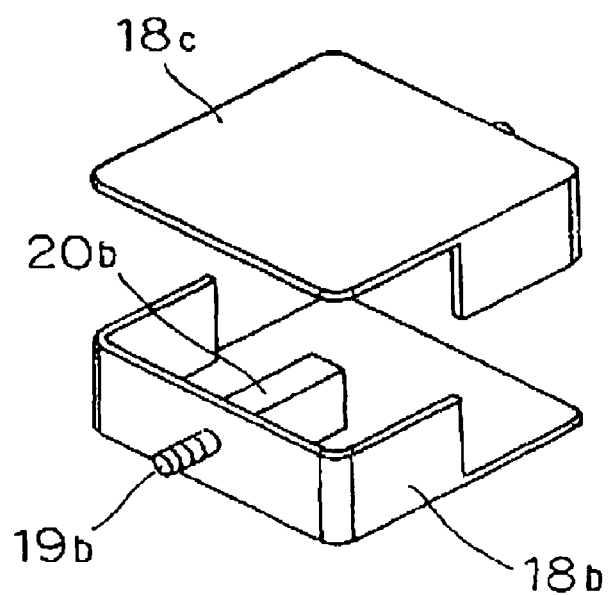
FIG. 15 is a diagram illustrating the internal structure of the reservoir tank in FIG. 14.
Figure 16:
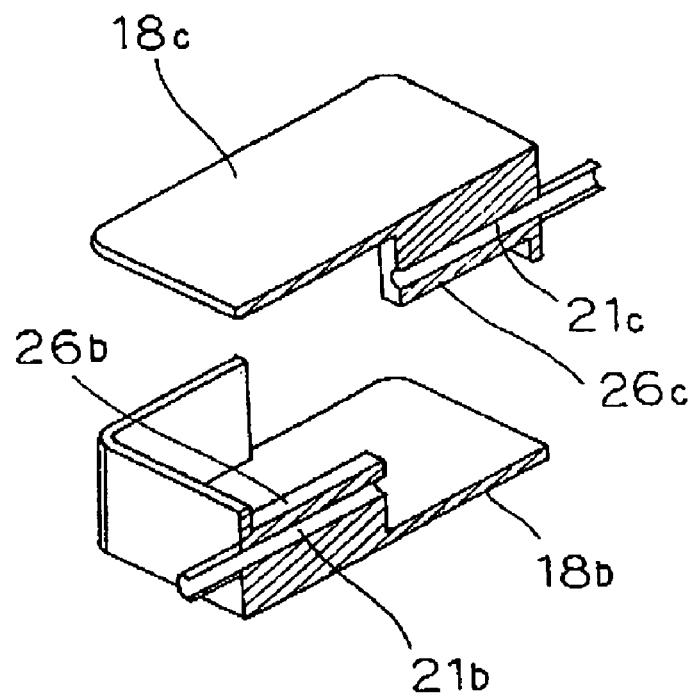
FIG. 16 is a perspective cross-sectional view illustrating the structure of the reservoir tank in FIG. 14.
Figure 17:
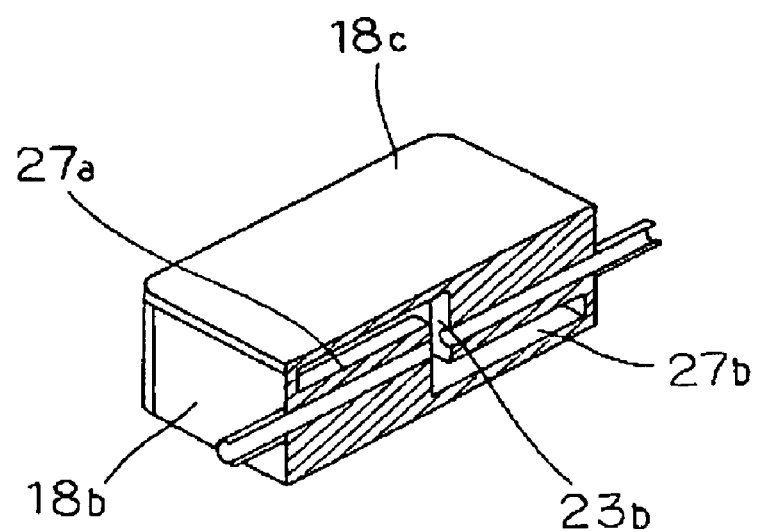
FIG. 17 is a perspective cross-sectional view of the reservoir tank in FIG. 14.
Figure 18:
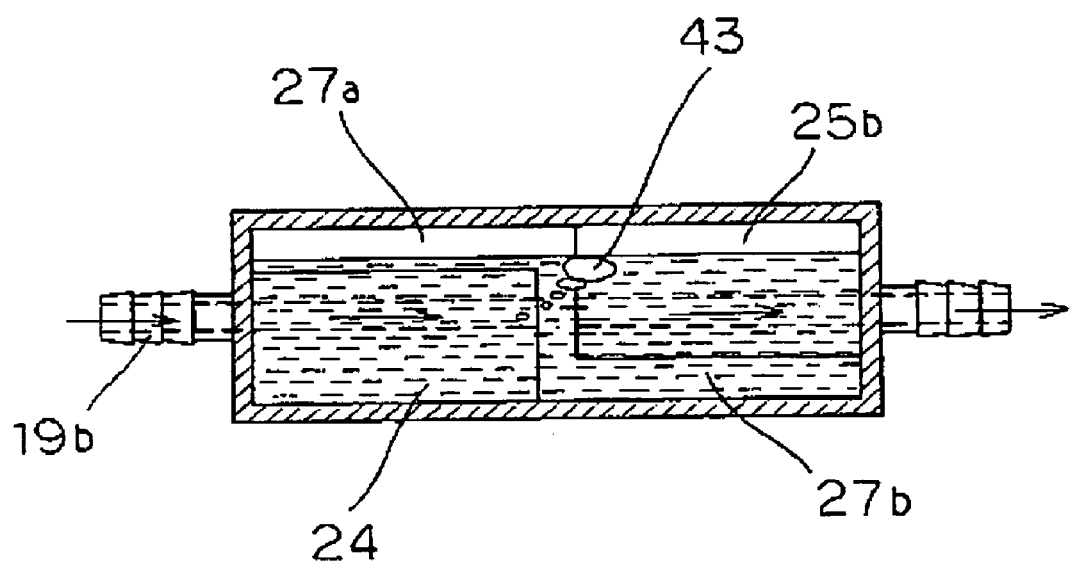
FIG. 18 is a diagram for describing the operation of the reservoir tank in FIG. 14.

FIGS. 14 to 18 illustrate the structure of a reservoir tank that is contained within a cooling apparatus according to a second embodiment of the present invention. FIG. 14 generally illustrates the reservoir tank; FIG. 15 illustrates the internal structure of the reservoir tank; FIG. 16 is a vertically sectioned, exploded perspective view of the reservoir tank; FIG. 17 is a vertically sectioned perspective view generally illustrating the reservoir tank; and FIG. 18 is a diagram for describing the operation of the reservoir tank.

Reservoir tank 5f of the second embodiment illustrated in FIGS. 14 to 18 further facilitates the movement of the accumulated air through the gap defined by the cut groove formed in the bridge within the reservoir tank disclosed in the first embodiment, and is characterized by a pair of axially symmetric members which are joined to form the reservoir tank.

Specifically, as illustrated in FIGS. 15 to 17, reservoir tank 5f comprises a pair, of tank body units 18b, 18c which have bridge 20b including coolant liquid circulating conduit 21b, 21c on a center axis thereof, and are axially symmetric to each other about the position of air trapping fault 23b. Tank body units 18b, 18c are vertically fitted to each other to complete reservoir tank 5f. Cut grooves 26b, 26c formed in bridge 20b are also axially and symmetrically arranged when tank body units 18b, 18c are fitted. Thus, as illustrated in FIG. 18, gaps 27a, 27b, through which the accumulated air moves in association with a change in the orientation in which an apparatus that holds the reservoir tank is installed, are vertically and symmetrically arranged as well, so that the accumulated layer of air 25b within the tank can stably move in whichever orientation at which the apparatus that contains the reservoir tank is installed.

Third Embodiment

Figure 19:
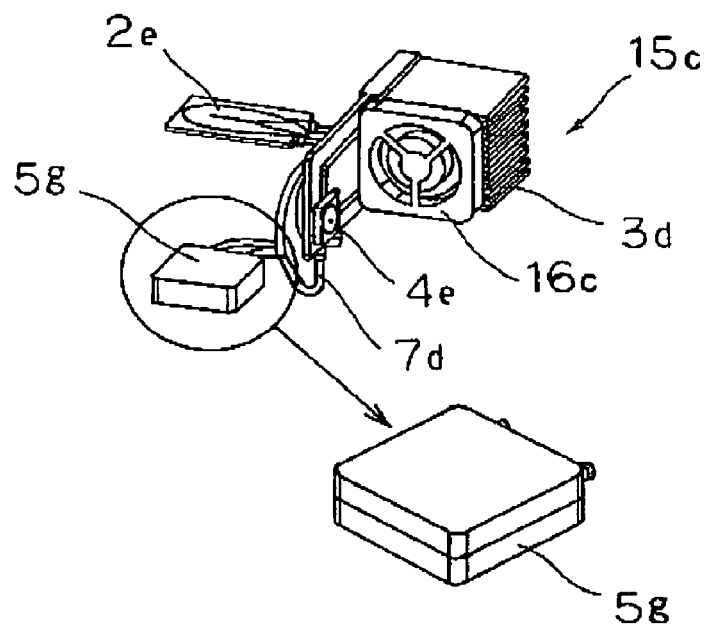
FIG. 19 is a diagram generally illustrating the structure of a cooling apparatus according to a third embodiment of the present invention and a reservoir tank associated therewith.
Figure 20:
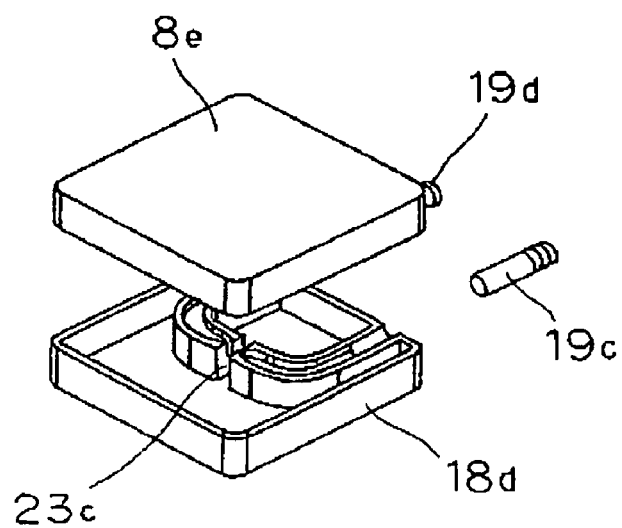
FIG. 20 is a diagram illustrating the internal structure of the reservoir tank in FIG. 19.
Figure 21:
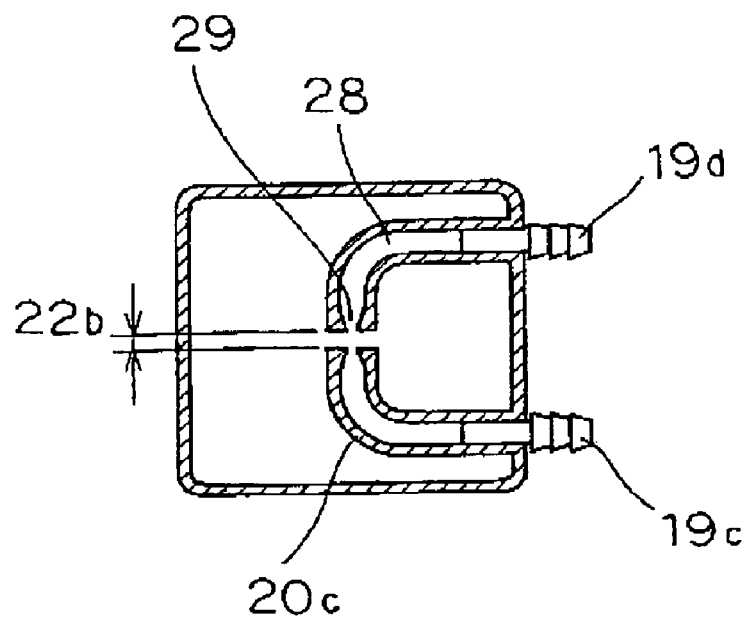
FIG. 21 is a top plan view of the reservoir tank in FIG. 19.
Figure 22:
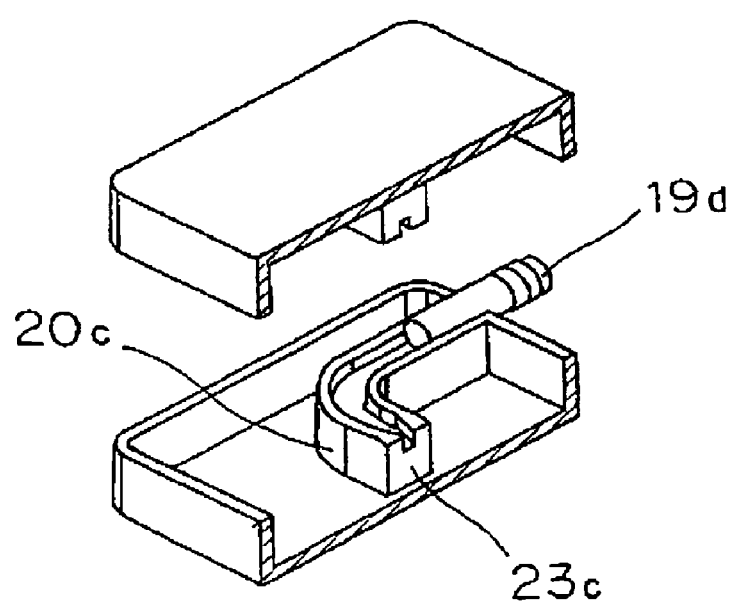
FIG. 22 is a perspective view illustrating the structure of the reservoir tank in FIG. 19.
Figure 23:
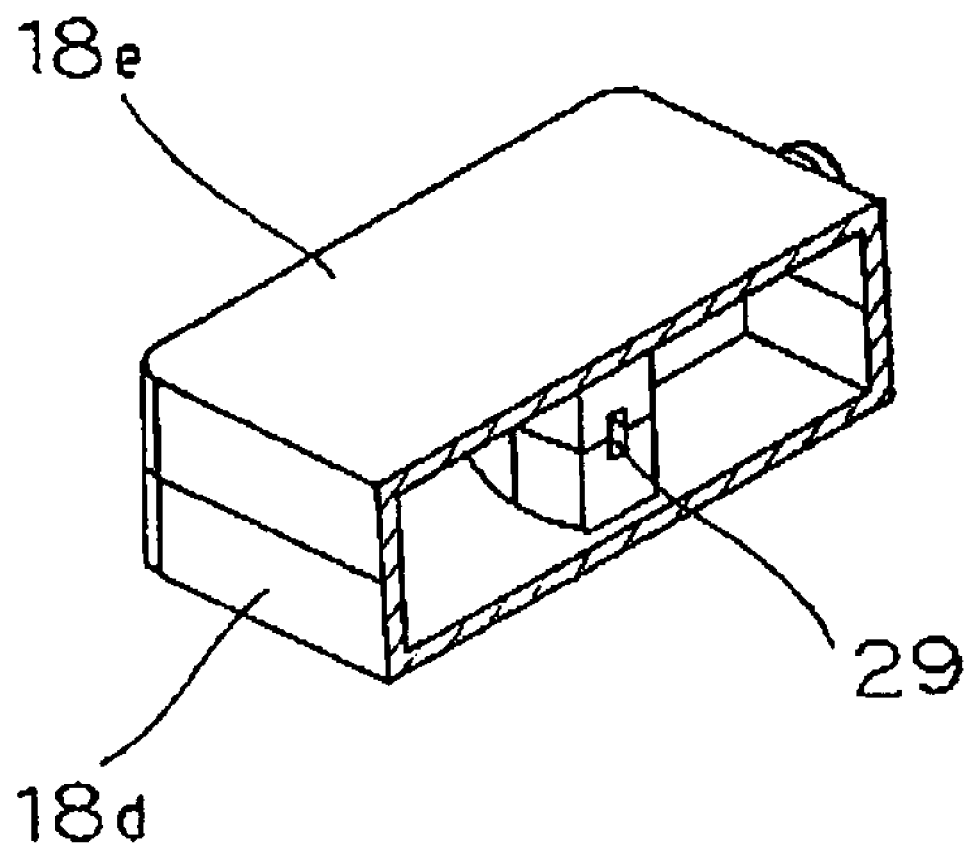
FIG. 23 is a perspective cross-sectional view of the reservoir tank in FIG. 19.

FIGS. 19 to 23 illustrate the configuration of a reservoir tank that is contained within a cooling apparatus according to a third embodiment of the present invention. FIG. 19 generally illustrates the reservoir tank; FIG. 20 illustrates the internal structure of the reservoir tank; FIG. 21 is a horizontally sectioned top plan view of the reservoir tank; FIG. 22 is a vertically sectioned, exploded perspective view of the reservoir tank; and FIG. 23 is a vertically sectioned perspective view generally illustrating the reservoir tank.

Cooling apparatus 15c of the third embodiment illustrated in FIGS. 19 to 23 makes the circulating system compact by positioning the coolant liquid inlet port and the coolant liquid outlet port of the reservoir tank in the first embodiment on the same side, with the intention of facilitating the mounting of cooling apparatus 15c to an electronic device.

Specifically, in FIGS. 19 to 23, cooling apparatus 15c of this embodiment comprises radiator 3d, radiation fan 16c, circulating pump 4e, reservoir tank 5g, and heat receiving element 2e such as a cold plate. As illustrated in FIG. 19, reservoir tank 5g, which has an inlet port and an outlet port, connected to resin tube 7d and positioned to face in the same direction, keeps a coolant liquid, retains an air layer for buffering the thermal expansion of the coolant liquid caused by received heat, and traps bubbles produced in the circulating system.

As illustrated in FIG. 20, reservoir tank 5g comprises a pair of tank body units 18d, 18e arranged in mirror symmetry, and tube joints 19c, 19d which are coupled to tank body units 18d, 18e, respectively. As illustrated in FIG. 21, tank body units 18d, 18e contain U-shaped bridge 20c integrally formed therewith, and conduit grooves 28 are formed on joining surfaces of U-shaped bridge 20c, such that conduit grooves 28 are formed into a U-shaped coolant liquid circulating conduit when a pair of upper and lower body tank units 18d, 18e are joined to each other.

Also, air trapping fault 23c is formed at the bent portion of U-shaped bridge 20c at which narrow gap 22b divides conduit groove 28, as can be seen in FIGS. 21 and 22. Further, restriction 29 having a width smaller than that of conduit groove 28 is formed at a location of conduit groove 28 open to air trapping fault 23c, as can be seen in FIGS. 21 and 23.

FIGS. 24A-24D, 25A-25D, 26A-26D illustrate bubble trapping operations of reservoir tank 5g of the embodiment described above in accordance with different orientations in which the apparatus containing the reservoir tank is installed.

Figure 24A:
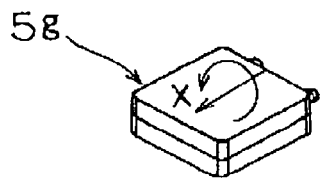
FIGS. 24A to 24D are diagrams illustrating in combination how an accumulated layer of air moves when the orientation of the reservoir tank in FIG. 19 is changed about the X-axis.
Figures 24B, 24C, 24D:
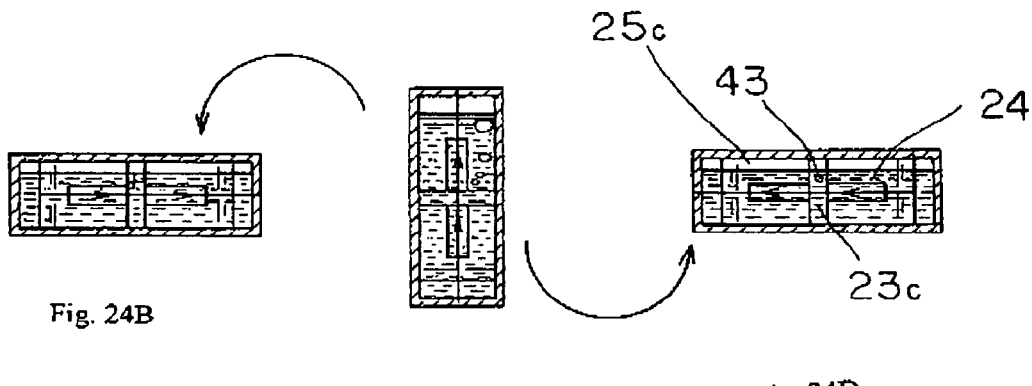
Figure 25A:
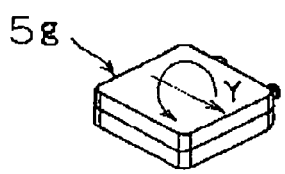
FIGS. 25A to 25D are diagrams illustrating in combination how an accumulated layer of air moves when the orientation of the reservoir tank in FIG. 19 is changed about the Y-axis.
Figures 25B, 25C, 25D:
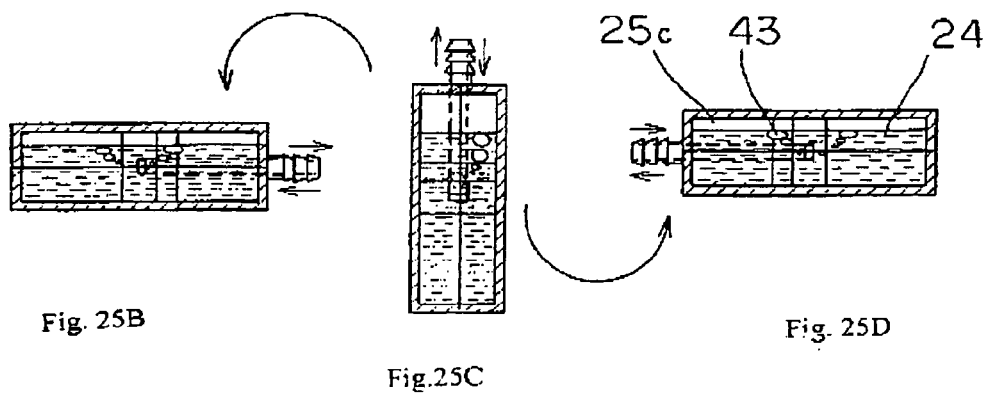
Figure 26A:
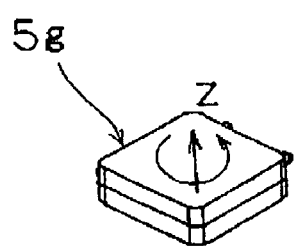
FIGS. 26A to 26D are diagrams illustrating in combination how an accumulated layer of air moves when the orientation of the reservoir tank in FIG. 19 is changed about the Z-axis.
Figure 26B:
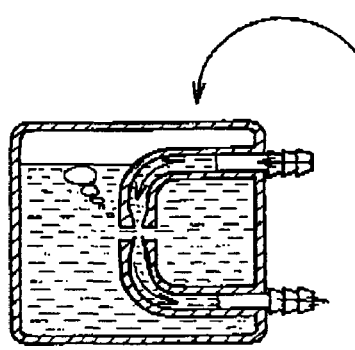
Figure 26C:
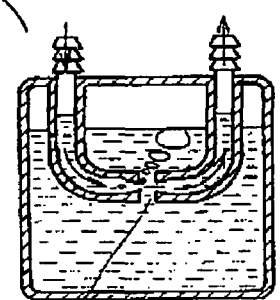
Figure 26D:
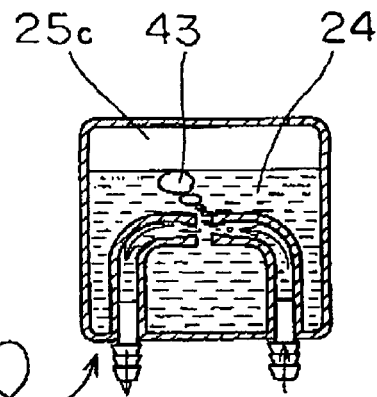

FIGS. 24B to 24D illustrate how the accumulated layer of air 25c in the reservoir tank moves in relation to a rotation of the reservoir tank about the coolant liquid circulating conduit (about an X-axis in FIG. 24A); FIGS. 25B to 25D illustrate how the accumulated layer of air 25c in the reservoir tank moves in relation to a rotation of the reservoir tank about an axis orthogonal to the coolant liquid circulating conduit (about a Y-axis in FIG. 25A); and FIGS. 26B to 26D illustrate how the accumulated layer of air 25c in the reservoir tank moves in relation to a rotation about a vertical axis (about a Z-axis in FIG. 26A). FIGS. 24C, 25C, 26C each illustrate that is a state rotated by 90.degree. from the state illustrated in FIGS. 24B, 25B, 26B, respectively, FIGS. 24D, 25D each illustrate a state that is further rotated by 90.degree. from the state illustrated in FIGS. 24C, 25C, respectively, and FIG. 26D illustrates a state that is further rotated by 180.degree. from the state illustrated in FIG. 26C. These figures also illustrate how minute bubbles 43 within the circulating conduit are trapped by air trapping fault 23c and combined with the accumulated layer of air 25c.

By thus providing the U-shaped coolant liquid circulating conduit within the reservoir tank, the inlet port and outlet port of the coolant liquid are oriented in the same direction, so that the liquid cooling system can be connected in a compact manner, thus facilitating mounting to an electronic device.

Further, by defining air trapping fault 23c at a position that changes the flow direction in the U-shaped coolant liquid circulating conduit, a conduit opening is arranged at a middle position of the tank. Thus, like the first embodiment, since the accumulated layer of air 25c does not interfere with the conduit opening in whichever direction the orientation is changed, the coolant liquid can be stably pumped out with stability. Also, with restriction 29 formed at the opening of U-shaped conduit groove 28, bubbles are unlikely to flow back into the conduit when air remaining in the tank moves in response to a change in the orientation.

Fourth Embodiment

Figure 27:
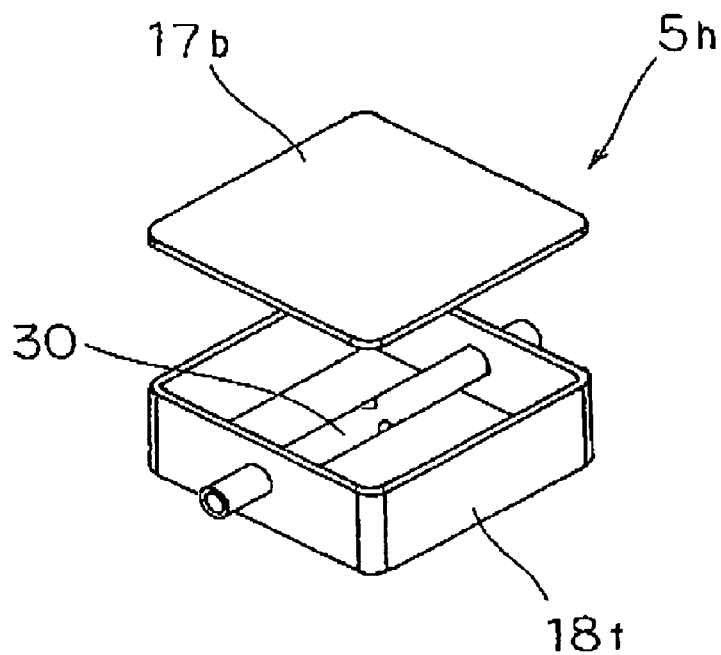
FIG. 27 is a is a diagram illustrating the internal structure of a reservoir tank associated with a cooling apparatus according to a fourth embodiment of the present invention.
Figure 28:
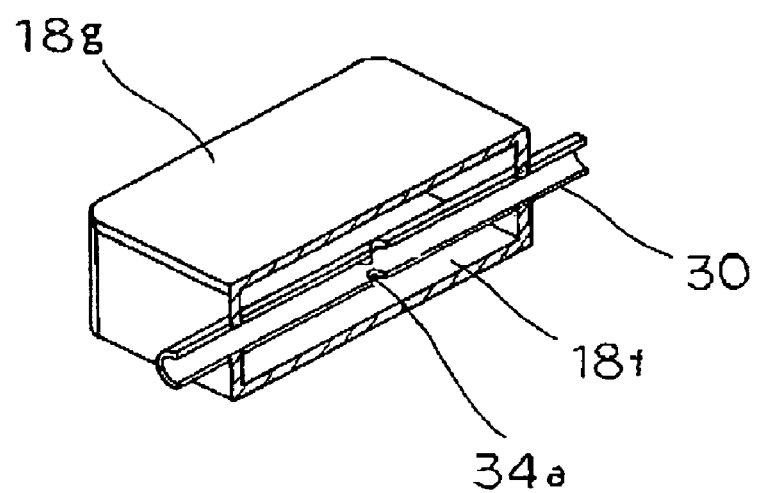
FIG. 28 is a perspective cross-sectional view of the reservoir tank in FIG. 27.

FIGS. 27 to 30 illustrate the configuration of a reservoir tank that is contained within a cooling apparatus according to a fourth embodiment of the present invention. FIG. 27 illustrates the internal structure of the reservoir tank; FIG. 28 is a vertically sectioned perspective view of the reservoir tank; FIGS. 29A to 29C illustrate in detail a conduit tube within the reservoir tank; and FIG. 30 is a diagram for describing the operation of the reservoir tank.

Reservoir tank 5h of the fourth embodiment illustrated in FIGS. 27 to 30 is used to improve the productivity of the reservoir tank illustrated in the first embodiment. Specifically, the bridge and coolant liquid circulating conduit in the first embodiment are made of a single circular tube which is separated from the tank body units.

Figure 29A:
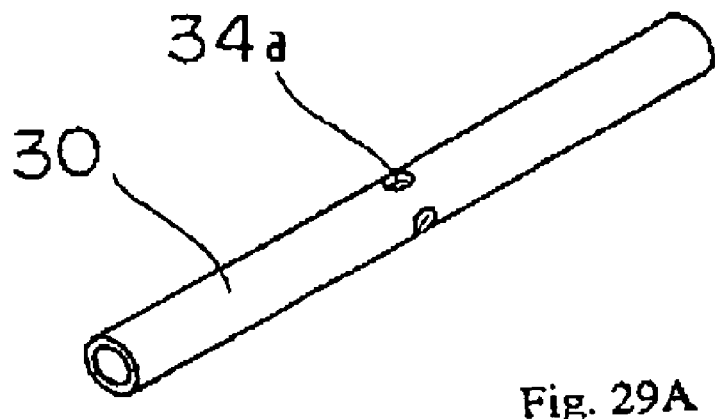
FIGS. 29A to 29C are diagrams illustrating in detail a conduit tube within the reservoir tank in FIG. 27.
Figure 29B:
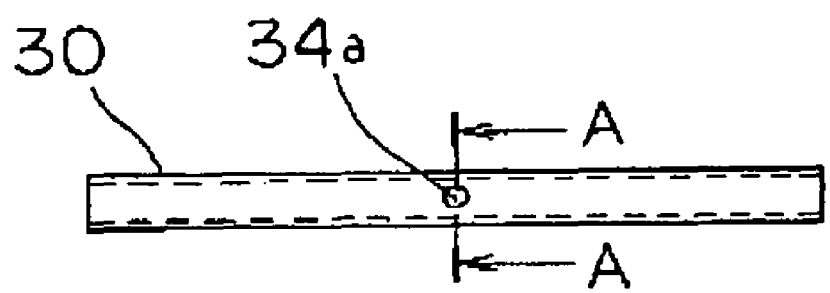
Figure 29C:
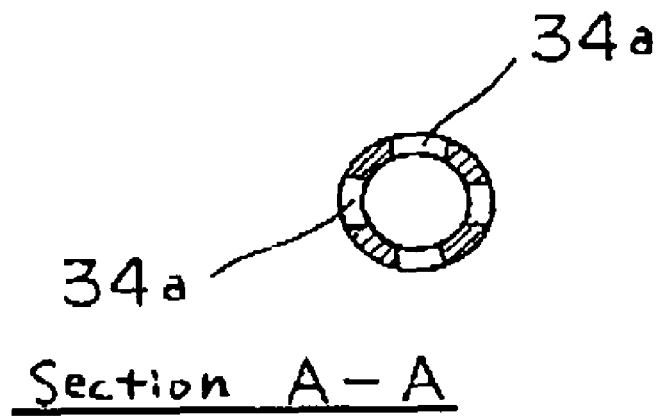
Figure 30A:
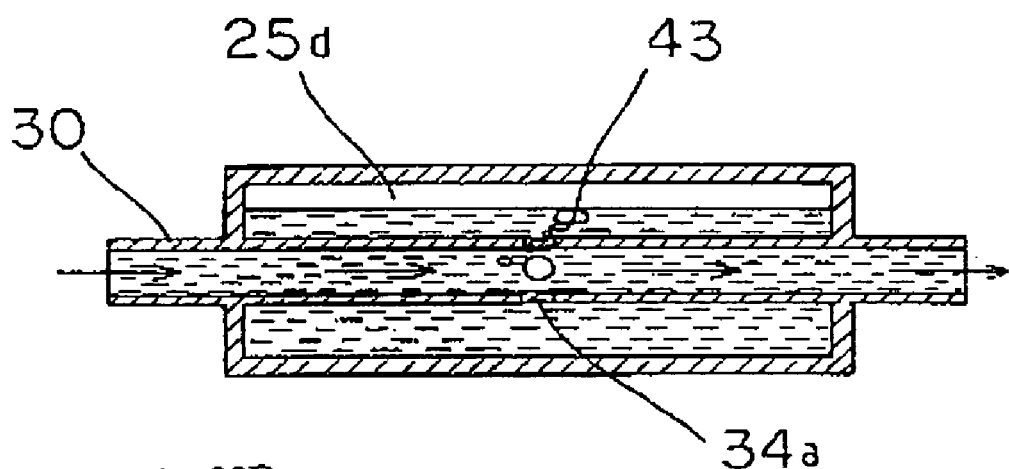
FIGS. 30A and 30B are diagrams for describing the operation of the reservoir tank in FIG. 27.
Figure 30B:
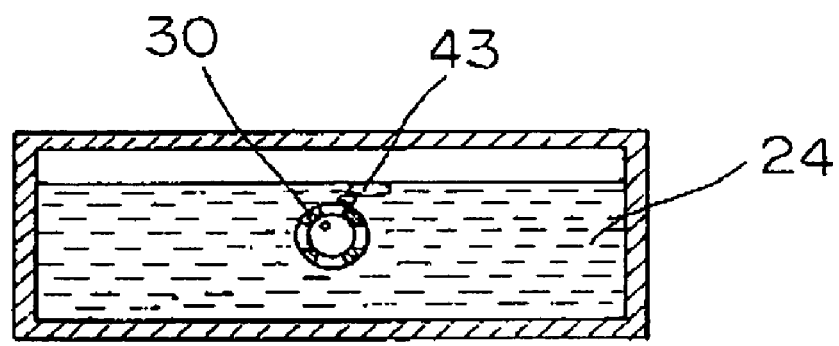

As illustrated in FIG. 27, reservoir tank 5h of this embodiment comprises tank body unit 18f; single coolant liquid circulating conduit tube 30 extending through tank body unit 18f along the center axis thereof; and tank cover 17b joined to tank body unit 18f. As illustrated in FIGS. 29A to 29C, cross-shaped air trapping through-hole 34a is formed through coolant liquid circulating conduit tube 30 at a middle position of the tank in a form perpendicular to the conduit. Here, air trapping through-hole 34a extends vertically and horizontally through coolant liquid circulating conduit tube 30 because the reservoir tank can generally support the any orientation at which the apparatus, which holds the tank, is installed. Based on this design, the conduit opening for trapping bubbles can be specified at the center of the tank, as illustrated in FIGS. 30A and 30B, so that the accumulated layer of air 25d can be prevented from interfering with the conduit in any orientation, and a gap for moving the air layer can be defined in a space outside of cooling liquid circulating conduit tube 30.

Fifth Embodiment

Figure 31:
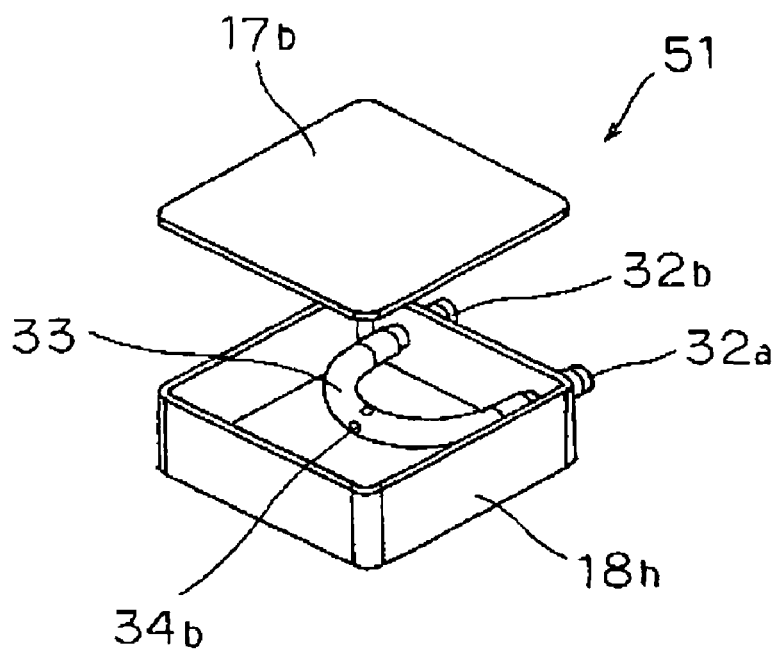
FIG. 31 is a diagram illustrating the internal structure of a reservoir tank associated with a cooling apparatus according to a fifth embodiment of the present invention.
Figure 32:
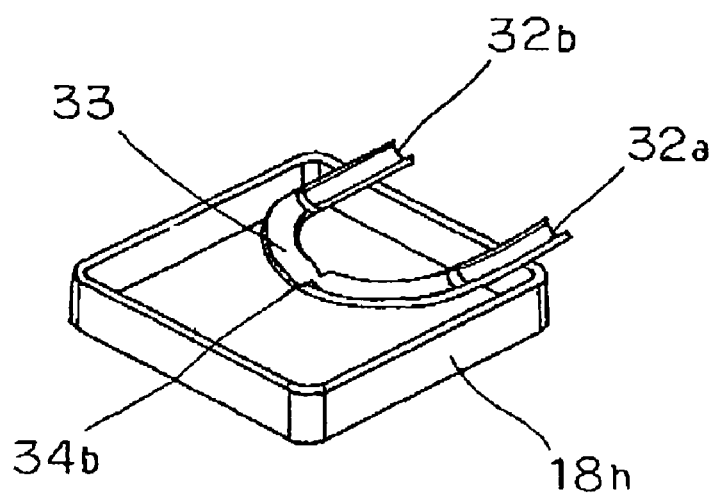
FIG. 32 is a horizontal sectional view of the reservoir tank in FIG. 31.
Figure 33:
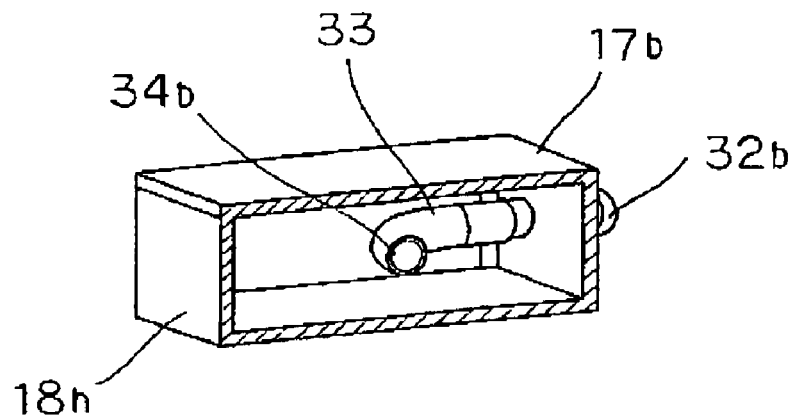
FIG. 33 is a vertical sectional view of the reservoir tank in FIG. 31.
Figure 34A:
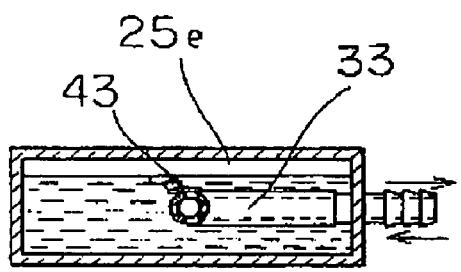
FIGS. 34A and 34B are diagrams for describing the operation of the reservoir tank in FIG. 31.
Figure 34B:
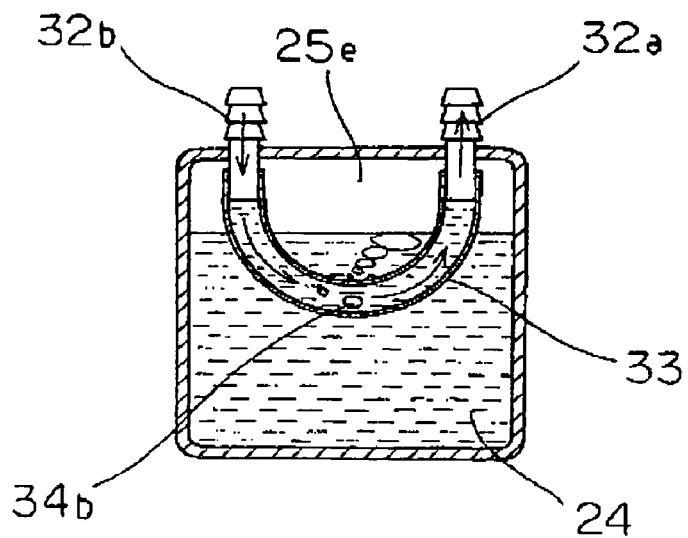

FIGS. 31 to 33, 34A and 34B illustrate the structure of a reservoir tank contained within a cooling apparatus according to a fifth embodiment of the present invention. FIG. 31 illustrates the internal structure of the reservoir tank; FIG. 32 is a horizontally sectioned perspective view of the reservoir tank; FIG. 33 is a vertically sectioned perspective view of the reservoir tank; and FIGS. 34A and 34B are diagrams for describing the operation of the reservoir tank.

Reservoir tank 5i of the fifth embodiment illustrated in FIGS. 31 to 33, 34A and 34B is used for improving the workability of the reservoir tank illustrated in the third embodiment. Specifically, the U-shaped bridge and U-shaped coolant liquid circulating conduit in the third embodiment are made of a single bent circular tube which is separated from the tank body units. In particular, in this embodiment, a flexible tube is employed for the circular tubes, as represented by a resin tube.

As illustrated in FIG. 31, a pair of joint tubes 32a, 32b are arranged in tank body unit 18h to handle an inflow coolant liquid and an outflow coolant liquid, respectively, in the same direction. Open ends of two joint tubes 32a, 32b on the inside of the tank body are connected to resin-made conduit tube 33 curved in a U-shape to constitute a circulating conduit. At a position that changes the flow direction in conduit tube 33 at the center of the tank, air trapping through-hole 34b, as illustrated in FIG. 29 of the fourth embodiment, is defined in the horizontal and vertical directions (see FIGS. 32 and 33).

By using the reservoir tank in the structure as described above, the inlet port and outlet port of the circulating system are oriented in the same direction in the reservoir tank, so that the liquid cooling system can be made compact, thus facilitating the mounting to an electronic device. Further, as illustrated in FIGS. 34A, 34B, air trapping through-hole 34b is defined at a position that changes the flow direction in U-shaped conduit tube 33 to provide a conduit opening at the center of the tank, and the space outside conduit tube 33 is used as a gap for moving the accumulated layer of air 25e, thereby making it possible to provide a reservoir tank which can have any orientation. Further, by using a flexible tube for the U-shaped conduit tube, the resulting reservoir tank provides the ease of work and assembly.

Sixth Embodiment

Figure 35A:
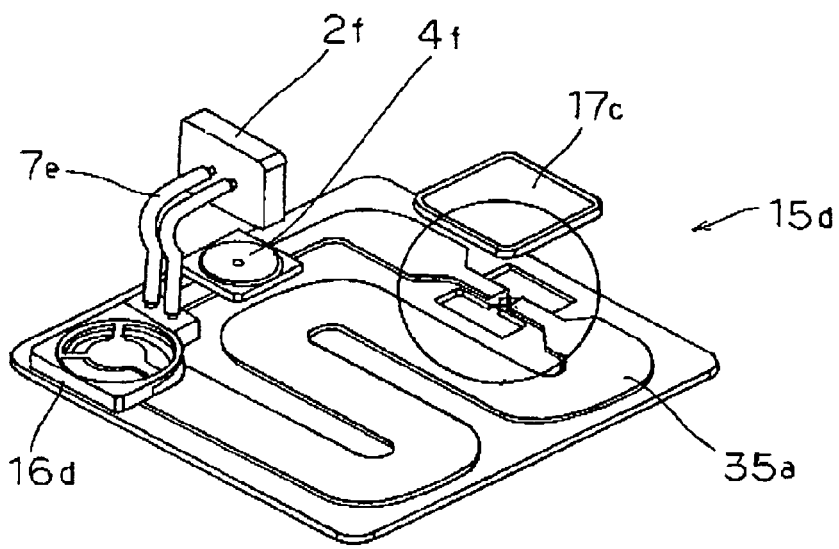
FIGS. 35A and 35B are diagrams each illustrating the structure of a reservoir tank associated with a cooling apparatus according to a sixth embodiment of the present invention.
Figure 35B:
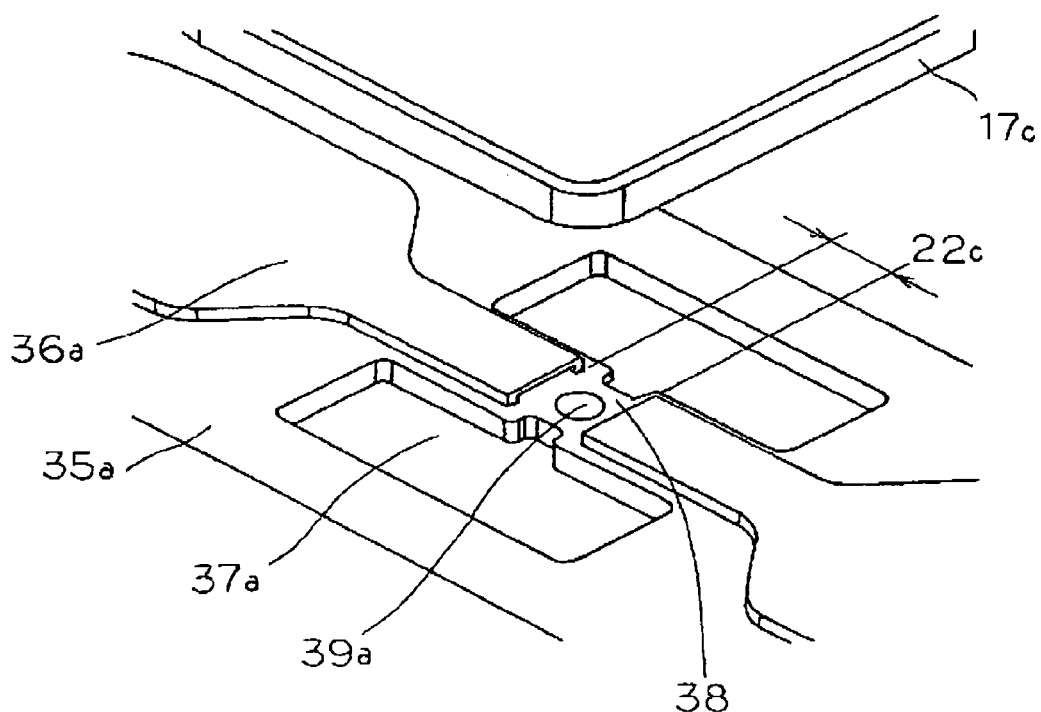
Figure 36:
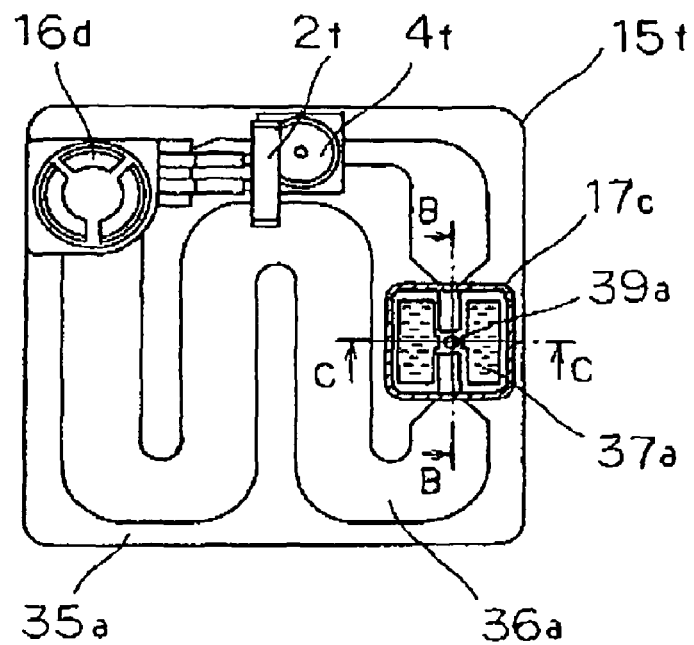
FIG. 36 is a plan view illustrating the cooling apparatus of FIG. 35.
Figure 37A:
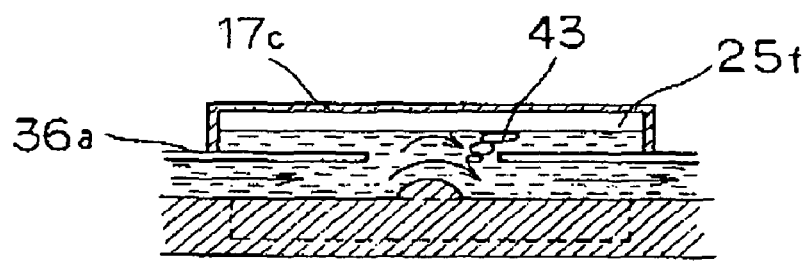
FIGS. 37A and 37B are diagrams for describing the operation of the reservoir tank in FIG. 35.
Figure 37B:
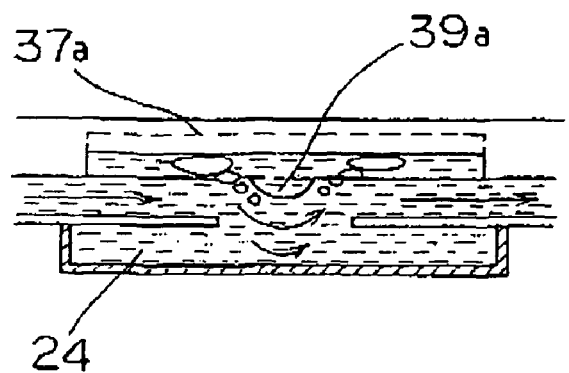
Figure 38A:
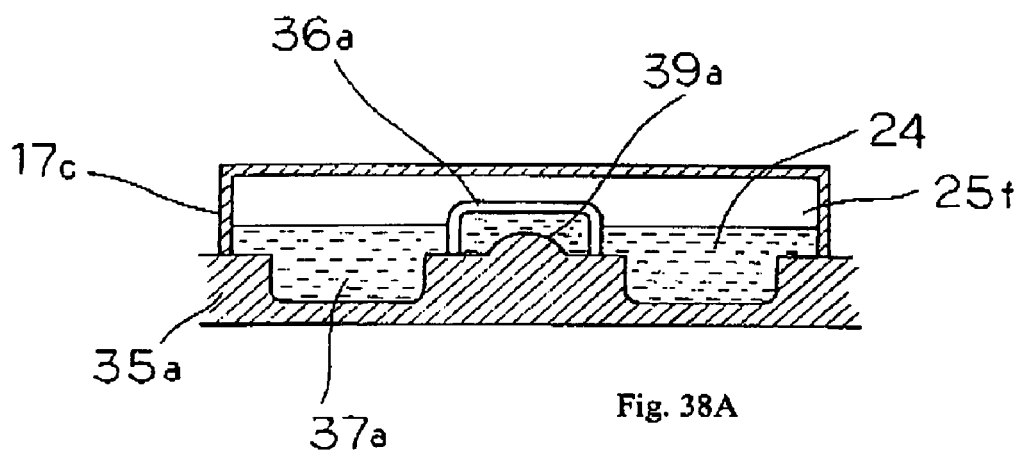
FIGS. 38A to 38C are side sectional views illustrating a variety of exemplary structures for the reservoir tank.
Figure 38B:
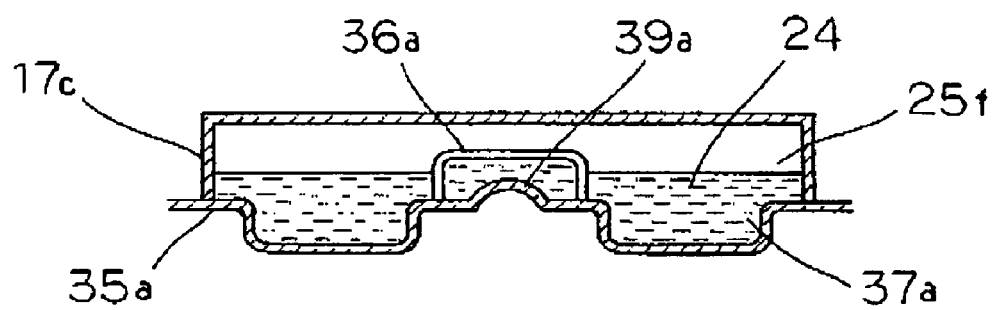
Figure 38C:
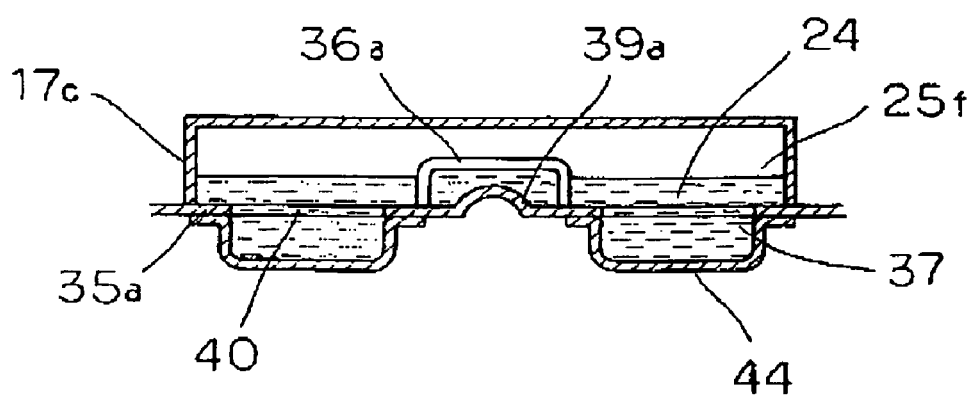

FIG. 35A is a diagram generally illustrating the structure of a reservoir tank that is included within a cooling apparatus according to a sixth embodiment of the present invention, and FIG. 35B is a partially enlarged view of FIG. 35A. FIG. 36 is a plan view illustrating the cooling apparatus of this embodiment, and FIG. 37 is a diagram for describing the operation of the reservoir tank. FIGS. 38A to 38C are side views illustrating a variety of exemplary structures for the reservoir tank.

Cooling apparatus 15d of this embodiment illustrated in FIGS. 35A and 35B comprises radiator 35a, radiation fan 16d, resin tube 7e, circulating pump 4f, a reservoir tank, and heat receiving element 2f such as a cold plate. Radiator 35a employs a thin structure as formed by joining two thin plates each formed with a conduit groove for circulating a coolant liquid. The reservoir tank is mounted on radiator 35a together with circulating pump 4f and radiation fan 16d to make up a liquid cooling module.

The cooling apparatus in this embodiment is characterized by comprising the reservoir tank mounted on the thin radiator which supports any orientation at which the apparatus, which holds the cooling system, is installed. Specifically, the reservoir tank is assembled by joining tank cover 17c to radiator 35a. Radiator conduit 36a, which extends to the tank cover joint of radiator 35a, is narrowed down in width at the middle position of the reservoir tank, and is divided by narrow gap 22c, as illustrated in FIG. 35B. On each of left and right radiator surfaces that are opposite to each other across opening 38 formed by the break, recessed cavity 37a is defined within the range in which it is covered by tank cover 17c (see FIG. 36). In opening 38 of radiator conduit 36a, pivot-shaped protrusion 39a is formed, as illustrated in FIG. 35B.

Next, the operation of the reservoir tank according to this embodiment will be described with reference to FIGS. 36 to 38A.

FIG. 36 is a plan view illustrating the cooling apparatus in this embodiment; FIG. 37 illustrates the air trapping operation on a cross-section taken along line B-B in FIG. 36. FIG. 37A assumes that the cooling apparatus is installed on a floor, while FIG. 37B assumes that the cooling apparatus is installed upside down. FIG. 38A illustrates the structure of the reservoir tank viewed on a cross-section taken along line C-C in FIG. 36.

In this embodiment, recessed cavities 37a are formed by being cut down in the thickness direction of radiator 35a. In this way, when tank cover 17c is coupled to radiator 35a, the stored coolant liquid and an air retention space can be provided at both the top and the bottom within tank cover 17c. Then, an air trapping fault is defined in a radiator conduit opening formed by narrow gap 22c at the center of the tank to trap bubbles. In this event, even if the orientation is reversed (see FIG. 37B), each recessed cavity 37a formed on the radiator surface retains the accumulated layer of air 25f on the ceiling side, so that the cooling apparatus can support the reversed installation of the cooling apparatus. Further, as illustrated in FIG. 37B, pivot-shaped protrusion 39a, formed in radiator conduit opening 38 disturbs the circulating flow to agitate bubbles, thus facilitating the introduction of bubbles into recessed cavities 37a defined to the left and right of conduit opening 38.

Now, FIGS. 38B and 38C illustrate other exemplary structures for the reservoir tank of this embodiment.

In the reservoir tank illustrated in FIG. 38B, radiator 35a is pressed to form recessed cavities 37a and protrusion 39a instead of the recessed cavities formed by cutting out a portion of the upper surface of radiator 35a, as illustrated in FIG. 38A. This exemplary structure is suited when a radiator is made of thin plates.

In the reservoir tank illustrated in FIG. 38C, through-hole 40 is formed through radiator 35a, and separate radiator cover 44 is joined from an opposite side of tank cover 17c to form recessed cavities 37a. This exemplary structure may be applied to the exemplary structure of FIG. 38B when there is not enough volume to form the recessed cavities by pressing.

While preferred embodiments of the present invention have been described using specific terms, such description is for illustrative purposes only, and it is to be understood that changes and variations may be made without departing from the spirit or scope of the following claims.

What is claimed is:

1. A cooling apparatus comprising:
    a tank for keeping a coolant liquid and an air layer therein;
    a heat receiver in contact with a heat generating part for receiving heat therefrom;
    a radiator for radiating the heat absorbed by the coolant liquid; and
    a circulating mechanism for circulating the coolant liquid from said heat receiver through said tank, through said radiator and again to said heat receiver,
    wherein said radiator comprises a coolant liquid circulating conduit, said coolant liquid circulating conduit including a portion passing through said tank,
    wherein said tank is mounted on said radiator,
    wherein said coolant liquid circulating conduit comprises a width narrower at a middle section of said portion of the coolant liquid circulating conduit than a width of another portion of said coolant liquid circulating conduit, said coolant liquid circulating conduit being divided by a gap at said middle section, and
    wherein said radiator includes cavities on both sides of the gap in said coolant liquid circulating conduit, each of said cavities comprising an area covered with said tank mounted on said radiator.

2. The cooling apparatus according to claim 1, further comprising a protrusion in the portion in which the gap in said coolant liquid circulating conduit is formed.

3. The cooling apparatus according to claim 1, wherein the heat generating part comprises an electronic device.

4. The cooling apparatus according to claim 1, wherein the heat generating part comprises a projector.

5. The cooling apparatus according to claim 2, wherein the heat generating part comprises a projector.

6. The cooling apparatus according to claim 1, wherein the gap comprises an opening in the coolant liquid circulating conduit.

7. The cooling apparatus according to claim 1, wherein the gap forms an opening between the coolant liquid circulating conduit and the tank.

8. The cooling apparatus according to claim 1, wherein the gap forms an opening between an interior of the coolant liquid circulating conduit and the middle position of the tank.

9. The cooling apparatus according to claim 1, wherein the radiator comprises two plates joined together so as to form a groove, the groove forming a part of the coolant liquid circulating conduit.

10. The cooling apparatus according to claim 1, wherein the tank comprises a tank cover joined to a portion of the radiator including the cavities.

11. The cooling apparatus according to claim 1, wherein the middle section in which the gap in said coolant liquid circulating conduit is formed includes a protrusion.

12. The cooling apparatus according to claim 1, wherein the cavities comprise a through-hole formed in the radiator, and
    wherein the cavities further include a separate radiator cover joined to the radiator.

13. The cooling apparatus according to claim 1, wherein the cavities are formed so as to extend into said radiator past a plane of the radiator which forms a wall of the coolant liquid circulating conduit.

14. The cooling apparatus according to claim 1, wherein the gap comprises an opening in a side wall of the coolant liquid circulating conduit.

* * * * *